US007064393B2

(12) United States Patent
Mergens et al.

(10) Patent No.: US 7,064,393 B2
(45) Date of Patent: Jun. 20, 2006

(54) ELECTROSTATIC DISCHARGE PROTECTION STRUCTURES HAVING HIGH HOLDING CURRENT FOR LATCH-UP IMMUNITY

(75) Inventors: Markus Paul Josef Mergens, Plainsboro, NJ (US); Cornelius Christian Russ, Princeton, NJ (US); John Armer, Middlesex, NJ (US); Koen Gerard Maria Verhaege, Gistel (BE); Phillip Czeslaw Jozwiak, Plainsboro, NJ (US)

(73) Assignees: Sarnoff Corporation, Princeton, NJ (US); Sarnoff Europe, Gistel (BE)

( * ) Notice: Subject to any disclaimer, the term of this patent is extended or adjusted under 35 U.S.C. 154(b) by 78 days.

(21) Appl. No.: 10/783,844

(22) Filed: Feb. 20, 2004

(65) Prior Publication Data
US 2004/0164356 A1 Aug. 26, 2004

Related U.S. Application Data

(62) Division of application No. 10/099,263, filed on Mar. 15, 2002, now Pat. No. 6,803,633.

(60) Provisional application No. 60/276,420, filed on Mar. 16, 2001, provisional application No. 60/280,343, filed on Mar. 30, 2001, provisional application No. 60/280,344, filed on Mar. 30, 2001, provisional application No. 60/280,439, filed on Mar. 30, 2001, provisional application No. 60/280,441, filed on Mar. 30, 2001, provisional application No. 60/280,443, filed on Mar. 30, 2001.

(51) Int. Cl.
*H01L 23/62* (2006.01)

(52) U.S. Cl. ........................ 257/360; 257/355; 257/288; 438/197

(58) Field of Classification Search ................ 257/360, 257/355, 288; 438/197
See application file for complete search history.

(56) References Cited

U.S. PATENT DOCUMENTS

| 4,633,283 A | 12/1986 | Avery |
| 5,012,317 A | 4/1991 | Rountre |
| 5,274,262 A * | 12/1993 | Avery ........................ 257/362 |
| 5,336,908 A | 8/1994 | Roberts |
| 5,400,202 A | 3/1995 | Metz et al. |
| 5,452,171 A | 9/1995 | Metz et al. |
| 5,473,169 A | 12/1995 | Ker et al. |
| 5,528,188 A | 6/1996 | Au et al. |

(Continued)

FOREIGN PATENT DOCUMENTS

EP 0 772 274 A2 5/1997

(Continued)

OTHER PUBLICATIONS

Watt, et al., "A Hot-Carrier Triggered SCR for Smart Power Bus ESD Protection", IEDM, 95-341-344, 1995.

*Primary Examiner*—Nathan J. Flynn
*Assistant Examiner*—Scott R. Wilson
(74) *Attorney, Agent, or Firm*—William J. Burke

(57) ABSTRACT

An electrostatic discharge (ESD) protection device having high holding current for latch-up immunity. The ESD protection circuit is formed in a semiconductor integrated circuit (IC) having protected circuitry. The ESD protection device includes a silicon controlled rectifier (SCR) coupled between a protected supply line of the IC and ground. A trigger device is coupled from the supply line to a first gate of the SCR, and a first substrate resistor is coupled between the first gate and ground. A first shunt resistor is coupled between the first gate and ground, wherein the shunt resistor has a resistance value lower than the substrate resistor.

48 Claims, 18 Drawing Sheets

U.S. PATENT DOCUMENTS

| | | | |
|---|---|---|---|
| 5,541,801 A * | 7/1996 | Lee et al. ............... 361/56 |
| 5,682,047 A | 10/1997 | Consiglio et al. |
| 5,708,288 A | 1/1998 | Quigley et al. |
| 5,781,388 A | 7/1998 | Quigley |
| 5,869,873 A | 2/1999 | Yu |
| 5,907,462 A | 5/1999 | Chatterjee et al. |
| 5,949,634 A | 9/1999 | Yu |
| 5,986,290 A | 11/1999 | Apfel |
| 6,008,508 A | 12/1999 | Bergemont et al. |
| 6,011,420 A | 1/2000 | Watt et al. |
| 6,016,002 A | 1/2000 | Chen et al. |
| 6,031,405 A | 2/2000 | Yu |
| 6,061,218 A | 5/2000 | Ida et al. |
| 6,066,879 A | 5/2000 | Lee et al. |
| 6,091,593 A | 7/2000 | Lin |
| 6,233,130 B1 | 5/2001 | Lin |
| 6,268,992 B1 | 7/2001 | Lee et al. |
| 6,353,237 B1 | 3/2002 | Yu |
| 6,850,397 B1 * | 2/2005 | Russ et al. ............ 361/91.8 |
| 2002/0020880 A1 | 2/2002 | Yu |

FOREIGN PATENT DOCUMENTS

| | | |
|---|---|---|
| JP | 10-50494 | 10/1997 |
| JP | 10-134988 | 3/1998 |
| JP | 10-313110 | 11/1998 |

* cited by examiner

ELECTROSTATIC DISCHARGE PROTECTION STRUCTURES HAVING HIGH HOLDING CURRENT FOR LATCH-UP IMMUNITY

CROSS REFERENCES

This application is a division of U.S. patent application Ser. No. 10/099,263, filed Mar. 15, 2002 now U.S. Pat. No. 6,803,633, which claimed the benefit of U.S. Provisional Applications, Ser. No. 60/276,420, filed Mar. 16, 2001; Ser. No. 60/280,343, filed Mar. 30, 2001; Ser. No. 60/280,344, filed Mar. 30, 2001; Ser. No. 60/280,439, filed Mar. 30, 2001; Ser. No. 60/280,441, filed Mar. 30, 2001; and Ser. No. 60/280,443, filed Mar. 30, 2001; the contents of which are incorporated by reference herein.

FIELD OF THE INVENTION

This invention generally relates to the field of electrostatic discharge (ESD) protection circuitry, and more specifically, improvements for silicon controlled rectifier (SCR) circuits in the protection circuitry of an integrated circuit (IC).

BACKGROUND OF THE INVENTION

Silicon controlled Rectifiers (SCRs) have long been used over a broad range of technologies because of their superior performance. During an ESD event, the SCR is considered a superior device because the SCR acts as an almost ideal shunt element.

One concern in the industry about using SCRs as ESD protection devices is unintentional latch-up during normal operating conditions. Latch-up is an uncontrolled triggering of an (parasitic) SCR structure on the IC during normal operation, such that the supply voltage is shorted to ground. The holding currents of such (parasitic) SCR structures are specified in the industry as the minimum latch-up current. Typical values are a minimum of 100 milliamps, or up to 300–500 milliamps under severe operating conditions. A latch-up condition could lead to very high currents from the power supply that may permanently damage the IC.

One method to avoid latch-up in the SCR ESD protection devices is to provide serial coupled diodes between, for example, a pad and the anode of the SCR, such that the holding voltage is kept above the supply voltage. In other words, when the holding voltage is above the supply voltage (including some safety margin), the risk of a latch-up condition is avoided. Generally, there is a tendency in the industry to use lower voltages to power the IC's, yet there are circuit applications where even much higher voltages are required (e.g., automotive applications or IC's for certain functions in cellular phones). Accordingly, the higher the supply voltage, the more series diodes are required.

The use of the series diodes with the SCR has several disadvantages. A first disadvantage for such a high holding voltage is that a considerable number of serial coupled diodes would be a needed, which requires additional area (i.e., real estate) on the IC. A second disadvantage is that the serial diodes do not add functionality to the circuits on the IC, except for increasing the holding voltage. A third disadvantage is that a large number of series diodes (e.g., greater than three) may result in high leakage currents, due to a parasitic Darlington transistor to the-substrate that amplifies an initial leakage current and becomes more problematic at higher operating temperatures.

In particular, each serial diode forms a stage of the Darlington transistor, and the stages are connected such that the leakage current of one stage is being amplified by the next stage, and so forth. This is called the Darlington amplifier in standard circuit theory, and the more of these Darlington stages are coupled, the more leakage current is generated. Moreover, during high ambient or operating temperatures of the chip, the leakage current increases, because there is more thermal carrier generation. As such, the series diodes pose a strong limit to the application of the SCR devices for also satisfying the above-mentioned latch-up concern.

Therefore, there is a need in the art for an ESD protection device having a high immunity to a latch-up condition during normal operation of the circuit, while still being able to provide ESD protection to the IC circuitry.

SUMMARY OF INVENTION

The disadvantages heretofore associated with the prior art are overcome by various embodiments of an electrostatic discharge (ESD) protection circuit in a semiconductor integrated circuit (IC) having protected circuitry. The ESD protection circuit has a high holding current for latch-up immunity. In one embodiment, the ESD protection device includes a silicon controlled rectifier (SCR) coupled between a protected supply line of the IC and ground. A trigger device is coupled from the supply line to a first gate of the SCR, and a first substrate resistor is coupled between the first gate and ground. A first fixed shunt resistor is coupled between the first gate and ground, where the shunt resistor has a resistance value lower than the substrate resistor. During either a powered-on or powered-off IC state, the triggering and holding currents are above the specified latch-up current of the SCR.

In a second embodiment, the ESD protection device includes an SCR coupled between a protected supply line of the IC and ground. A trigger device is coupled from the supply line to a first gate of the SCR, and a first substrate resistor is coupled between the first gate and ground. A first variable shunt resistor is coupled between the first gate and ground, where the shunt resistor has a resistance value lower than the first substrate resistor. During a powered-on IC state, the triggering and holding currents are above the specified latch-up current of the SCR. However, during a powered-off IC state, the triggering current is below the specified latch-up current of the SCR.

BRIEF DESCRIPTION OF THE DRAWINGS

To facilitate understanding, identical reference numerals have been used where possible, to designate identical elements that are common to the figures.

DETAILED DESCRIPTION OF THE INVENTION

The present invention is described with reference to CMOS devices. However, those of ordinary skill in the art will appreciate that selecting different dopant types and adjusting concentrations allows the invention to be applied to Bipolar, BiCMOS, SiGe/BiCMOS, BCD, high-voltage process options and other processes that are susceptible to damage caused by ESD. The present invention includes various embodiments of a high holding current silicon controlled rectifier (HHISCR) ESD protection device having a turn-on voltage, a holding voltage, and high current clamping characteristics such that ESD protection device will not latch-up during normal operation.

The HHISCR ESD protection device is primarily utilized as a shunt between at least one voltage supply line (e.g., VDD) and ground. However, such configuration should not be considered as limiting. In particular, the voltage supplies of the IC may be capable of delivering currents exceeding 100 milliamps during normal operation, which is a typical (minimum) latch-up current specification in the industry. By contrast, the currents available by the signals to or from I/O pads are much smaller and are below the 100 milliamp latch-up specification.

The following embodiments of the HHISCR ESD protection device must protect the circuitry of the IC during an ESD event under non-powered conditions, while during normal operation of the IC (i.e., the IC is powered on), the ESD protection device must also satisfy certain latch-up (LU) requirements. When the IC is powered up, the ESD protection device is designed to provide a triggering and holding current that is greater than the specified latch-up current of the ESD protection device. Alternately, when the IC is not powered up, the ESD protection device is designed to provide a triggering and holding current that is less than or equal to the specified latch-up current of the ESD protection device.

Figure 1:
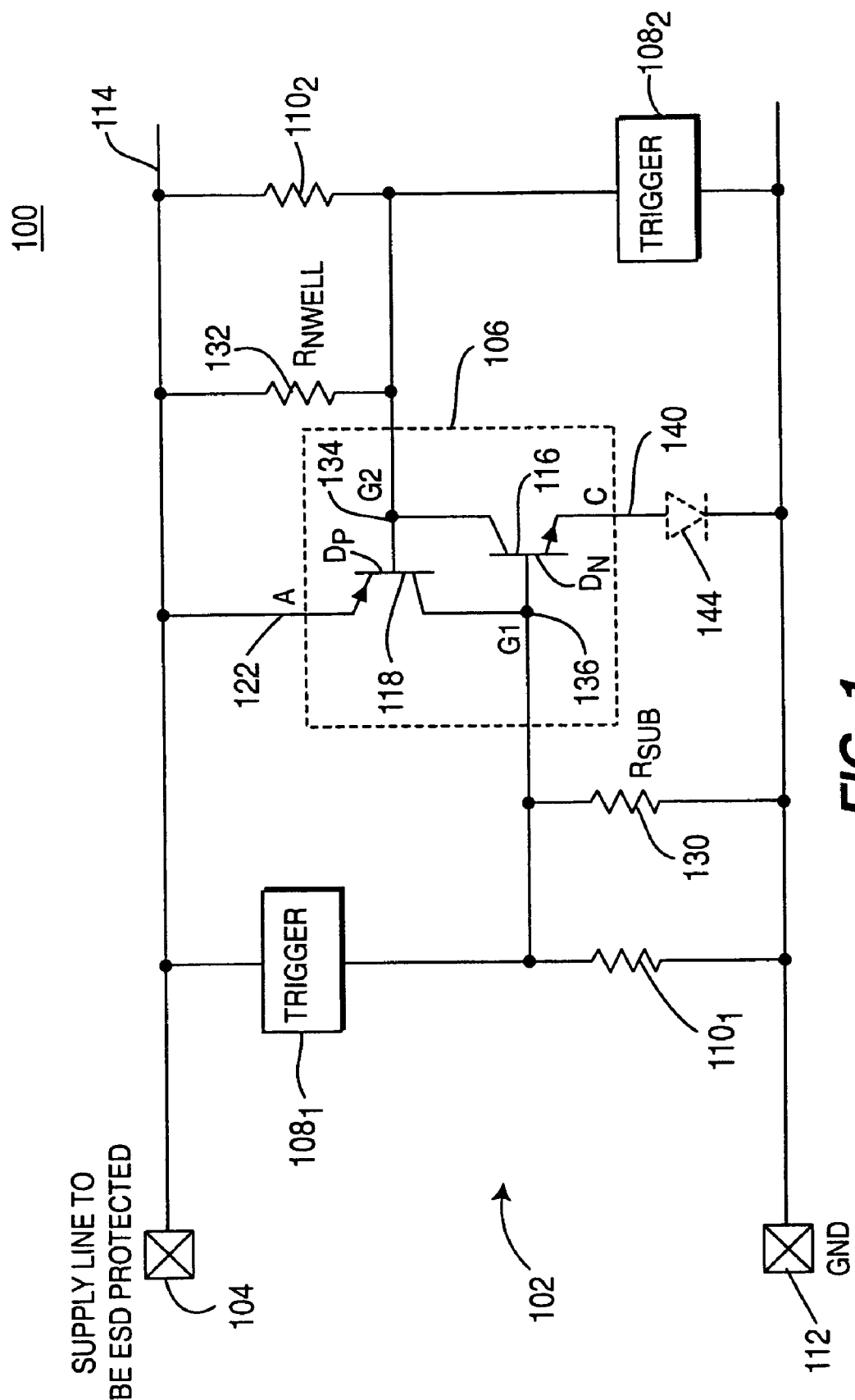
FIG. 1 depicts a schematic block diagram of a high holding current silicon controlled rectifier (HHISCR) ESD protection device of the present invention.

FIG. 1 depicts a schematic block diagram of a high holding current silicon controlled rectifier (HHISCR) ESD protection device 102 of the present invention. The HHISCR ESD protection device 102 of FIG. 1 is considered a general, non-actively controlled protection device that serves as a current shunt between a voltage supply line 114 and ground 112. The HHISCR protection device 102 comprises an SCR 106, at least one trigger device 108 for turn-on, and at least one low resistance shunt resistor 110, which together serve as a protection device 102 for the circuitry on an integrated circuit (IC) 100. The HHISCR protection device 102 protects the IC circuitry from electrostatic discharges (ESD) that may occur at a voltage supply line 104 to be protected of the IC circuitry 100. When turned on, the SCR 106 functions as a shunt to redirect any ESD currents from the voltage supply line 114 to ground. The trigger device 108 turns on, that is "triggers" the SCR 106 to avoid an over-voltage ESD condition.

Referring to the schematic diagram of FIG. 1, the SCR 106 is illustratively represented as an NPN transistor 116 and a PNP transistor 118, as is well known in the art. The emitter of the PNP transistor 118 forms an anode 122 of the SCR 106, which is connected to the voltage supply line 114. The collector of the PNP transistor 118 is connected to the base of the NPN transistor 116, which forms a first gate G1 136 of the SCR 106. Similarly, the collector of the NPN transistor 116 is coupled to the base of the PNP transistor 118, which forms a second gate G2 134 of the SCR 106. The emitter of the NPN transistor 116 is coupled to ground 112 to form the cathode 140 of the SCR 106.

The triggering and holding voltages and currents of the SCR 106 are controlled by coupling a trigger 108 and low resistance shunt resistor 110 to a gate of the SCR. In one embodiment, a single trigger device 108 and single shunt resistor 110 are utilized for triggering the SCR 106. For example, where the first gate 136 of the SCR 106 is used, a first trigger device $108_1$ is coupled between the voltage supply line 114 and the first gate G1 136, while a first low resistance shunt resistor $110_1$ is coupled from the first gate G1 136 to ground 112.

Alternatively, where the second gate 134 of the SCR 106 is used, a second trigger device $108_2$ is coupled between the second gate G2 134 and ground 112, while a second low resistance shunt resistor $110_2$ is coupled from the voltage supply line 114 to the second gate G2 134. In a third embodiment and as shown below in FIG. 3, both first and second trigger devices $108_1$ and $108_2$ and the low resistance shunt resistors $110_1$ and $110_2$ are respectively coupled to the first and second gates 136 and 134 as described above.

In one embodiment, the trigger devices 108 may be MOS devices, e.g., a grounded gate NMOS (GGNMOS) device or a source-connected gate PMOS (SGPMOS) device. Alternatively, the trigger devices may be a Zener diode in a reverse conduction direction, a small diode chain in a forward conduction direction, or other devices typically used in the art.

In one embodiment, the shunt resistors 110 are external on-chip resistors fabricated from, for example, silicided poly-silicon, and are selected with a resistance value (e.g., 0.1–10 ohms), which is much lower than the intrinsic substrate resistance $R_{sub}$ 130. The first and second resistors $110_1$ and $110_2$ serve as shunts for respectively directing currents to ground 112 or from the supply 114. As such, the first and second shunt resistors $110_1$ and $110_2$ are respectively in parallel with the base-emitter diodes of the NPN transistor 116 and PNP transistor 118 of the SCR. The shunt resistors 110 provide a path for undesirable leakage currents between the trigger devices 108 and ground 112 or the supply 114, respectively, which otherwise might unintentionally trigger the SCR 106. Furthermore, the low resistance resistors 110 will control the so-called trigger and holding currents of the SCR 106, as is described in detail below.

One or more optional diodes 144 (an exemplary diode drawn in phantom in FIG. 1) may be serially coupled in the forward conduction direction from the emitter of the NPN transistor 116 to ground 112 (cathode 144 of the SCR 106). The optional diode 144 is provided to establish a voltage drop between the emitter of the NPN transistor 116 and ground 112, as discussed in further detail below.

During normal operating conditions of the IC 100, the protective SCR 106, which comprises the NPN and PNP transistors 116 and 118, will not conduct current between the anode 122 and the grounded cathode 140. That is, the SCR 106 is turned off, since there is no high voltage (e.g., positive ESD voltage) applied to the voltage supply line 114. Rather, only the regular signal or operating voltage of the IC 100 appears on the supply line 114. In an instance where an ESD event causes an over voltage at the supply line 114, the illustrative first trigger device $108_1$ and resistor $110_1$ start to conduct considerable current.

Initially, a majority of the ESD current flows through the low resistance shunt resistor $110_1$ to ground 112, since the shunt resistor $110_1$ is in parallel with the intrinsic substrate resistance $R_{sub}$ 130 and the base-emitter of the NPN transistor 118 of the SCR 106. Once a voltage drop across the shunt resistor $110_1$ (and the parallel intrinsic resistance $R_{sub}$ 130 of the substrate) reaches approximately 0.7 volts, the NPN transistor 116 is turned on (i.e., triggered). Then, a portion of the current through the trigger device $108_1$ is fed into the trigger gate G1 136 of the SCR 106.

A person skilled in the art will recognize that the shunt resistor must be capable of carrying the high current prior to triggering of the SCR. In particular, the size of the resistor needs to large enough to carry such high current. Similarly, the size (i.e., width) of the trigger device carrying the large trigger current must also be adapted accordingly, based on the expected trigger current and the standard ESD performance data (current carrying capability) of the trigger device used.

Specifically, the base-emitter diode $D_n$ of the NPN transistor 116 is forward biased. As such, the NPN transistor 116 begins to conduct. The collector of the NPN transistor 116 provides carriers to the base of the PNP transistor 118, which turns on the PNP transistor 118. Once both transistors 116 and 118 of the SCR 106 are turned on, the regenerative conduction process of the SCR 106 enables the ESD current to be quickly shunted to ground 112.

Where the second gate 134 is used for triggering, a positive ESD event occurring at the supply line VDD 114 causes the trigger device $108_2$ to turn-on. The current produced by an ESD event flows initially through the trigger device and the low resistive shunt resistor $110_2$, rather than the intrinsic resistance $R_{nwell}$ 132 of the N-well. Once the voltage drop across the shunt resistor $110_2$, that is in parallel with the emitter-base $D_p$ of the PNP transistor 118 or the SCR 106, increases to approximately 0.7 volts, the voltage drop causes the PNP transistor to turn on. The latter initiates the regenerative SCR action to shunt the ESD pulse to ground 112.

During normal circuit operation (i.e. non-ESD), the shunt resistor $110_2$ also provides a path for undesirable leakage currents between the trigger device $108_2$ and ground 112, which otherwise might unintentionally trigger the SCR 106. Furthermore, the shunt resistor $110_2$ will control the so-called trigger and holding currents of the SCR 106.

Figure 2:
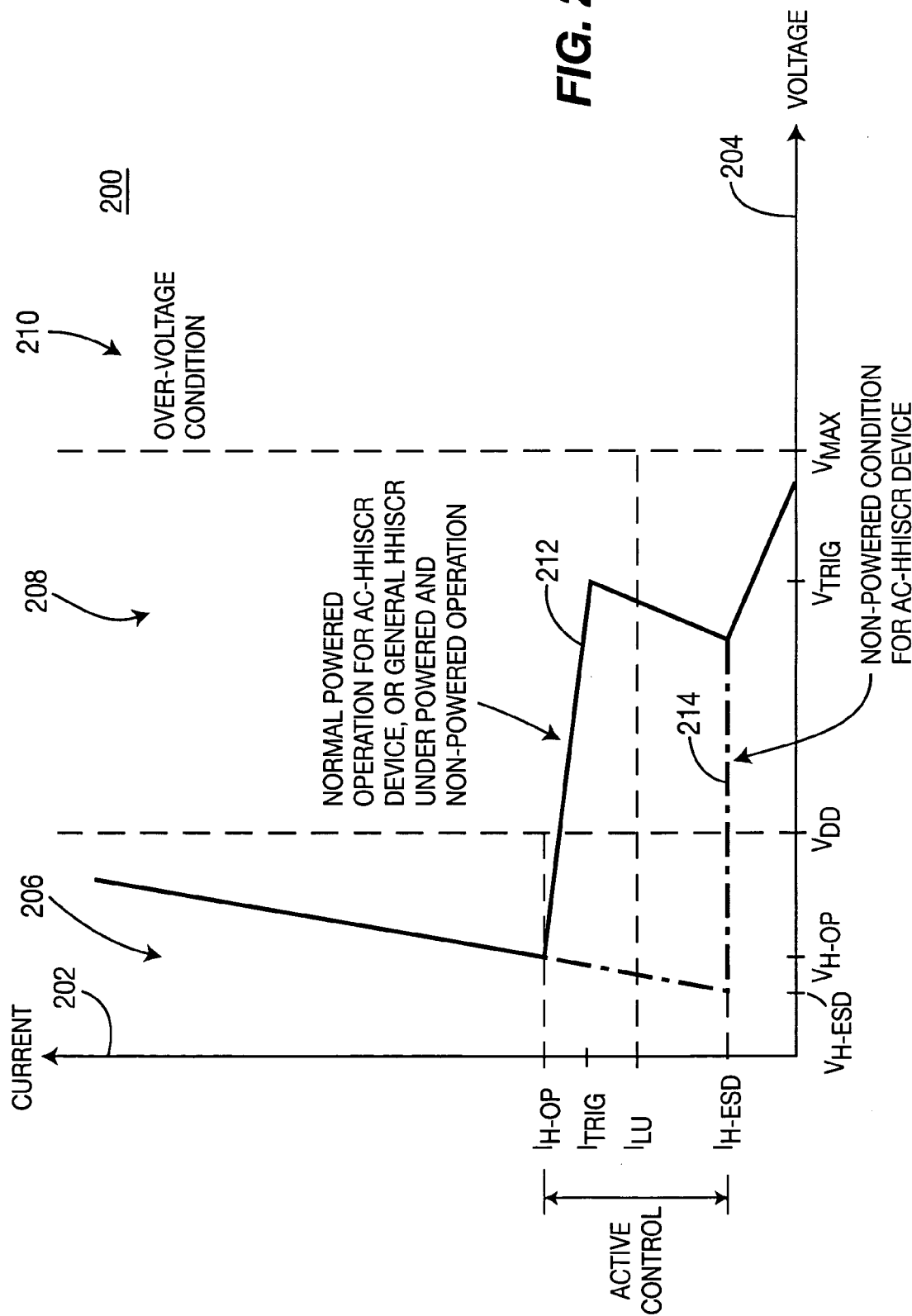
FIG. 2 depicts a graphical view representing current and voltage characteristics for the HHISCR ESD protection device.

Therefore, the SCR 106 will trigger when either the voltage across base-emitter diode $D_n$ of the NPN transistor 116 or the voltage across emitter-base diode $D_p$ of the PNP transistor 118 reaches approximately 0.7 volts. As shown in FIG. 2 below, the first and/or second trigger device 108 may be utilized to trigger and hold the SCR 106 above the latch-up current of the SCR 106.

It is noted that the optional diodes 144 are used to increase the triggering voltage and current as well as the holding current. In particular, a single optional diode 144 is also forward biased at approximately 0.7 volts. As such, the substrate to ground potential needs to reach approximately 1.4 volts for the SCR to turn on. For such an increased substrate potential, the trigger elements 108 will be required to provide higher trigger currents. Consequently, it will be more difficult to turn on the SCR, and therefore, higher trigger and holding currents will be achieved. It is further noted that additional diodes may be utilized to further increase the triggering voltage of the ESD protection device 102.

FIG. 2 depicts a graph of current and voltage characteristics 200 for the HHISCR ESD protection device 102 of the present invention. The graph comprises an ordinate 202 representing current characteristics of the ESD protection device 102, and an abscissa 204 representing voltage characteristics of the ESD protection device 102. The voltage characteristic is divided into three regions defined by particular voltages. In particular, a first region 206 is defined from zero volts to the actual supply voltage of the IC 100. The actual voltage may be any supply voltage required for IC operation. A second region 208 is defined above the supply voltage and below an over-voltage condition. A third region 210 for an over-voltage condition has a range of voltage transients that are considered harmful to the gate oxides of the IC 100. The latch-up current $I_{lu}$ is normally specified at 100 milliamps or 300 milliamps, which are typical industry standards.

Curves 212 and 214 represent the current and voltage (IV) characteristics 200 for various embodiments and operating conditions of the HHSCR protection device 102. In particular, curve 212 represents a general HHISCR protection device 102 as shown in FIG. 1 above, during both powered and unpowered IC operation. Furthermore, curve 212 represents an actively controlled (AC) HHISCR protection device during normal (i.e., powered) IC operation, as illustratively shown in FIGS. 3–8 below. Curve 214 also represents an actively controlled HHISCR protection device, but during non-powered IC operation, as illustratively shown in FIGS. 3–8 below.

Referring to curve 212, which represents normal operation of the IC 100 (general HHISCR of FIG. 1, as well as powered AC-HHISCRs), the general HHISCR protection device 102 is designed to have a trigger voltage $V_{trig}$ greater than the supply voltage VDD, and less than $V_{max}$. Thus, the trigger voltage $V_{trig}$ occurs in the second region 208 of the IV characteristics 200 for the HHISCR protection device 102. Additionally, the holding voltage $V_h$ or $V_{h-op}$ has a potential less than the voltage of the supply line to be protected (e.g., VDD). Further, the HHISCR protection device 102 has a trigger current $I_{trig}$ that is greater than the latch-up current $I_{lu}$. Moreover, the holding current $I_{OP}$ or $I_{H-op}$ is greater than latch-up current $I_{lu}$ (but not necessarily in case of hysterisis effects). Providing the holding currents above the specified latch-up current during normal IC operation helps provide latch-up immunity and interference with the functionality of the IC 100.

Referring to curve 214, which represents a non-powered condition for the actively controlled HHISCR of the IC 100, the HHISCR protection device 102 also has a holding voltage $V_{h\text{-}ESD}$ that is less than the voltage supply line to be protected (e.g., VDD). More importantly, in this non-powered state, the trigger current $I_{trig}$ is less than the latch-up current $I_{lu}$, in contrast to the trigger current $I_{trig}$ being greater than the latch-up current $I_{lu}$, during a powered condition. As such, the SCR 106 will quickly trigger during an ESD event when the IC 100 is in a non-powered state. As will be discussed regarding the actively controlled HHISCR embodiments depicted in FIGS. 3–8, the inventive SCR protection device 102 has a holding current $I_{H\text{-}ESD}$, under non-powered IC ESD conditions, below the specified latch-up current $I_{lu}$ of the HHISCR protection device 102.

FIGS. 3–8 depict schematic diagrams and structural views of various HHISCR ESD protection devices 102 that have the IV characteristics shown in FIG. 2. The ESD protection devices 106 in the embodiments of FIGS. 3, 4, and 6–8 are actively controlled and capable of protecting the IC circuitry from ESD transients, while providing a low triggering current when the IC 100 is turned off. Moreover, the ESD protection devices 106 provide a high triggering and holding current that satisfies the requirement for the minimum LU current when the IC 100 is powered under normal operating conditions.

Figure 3:
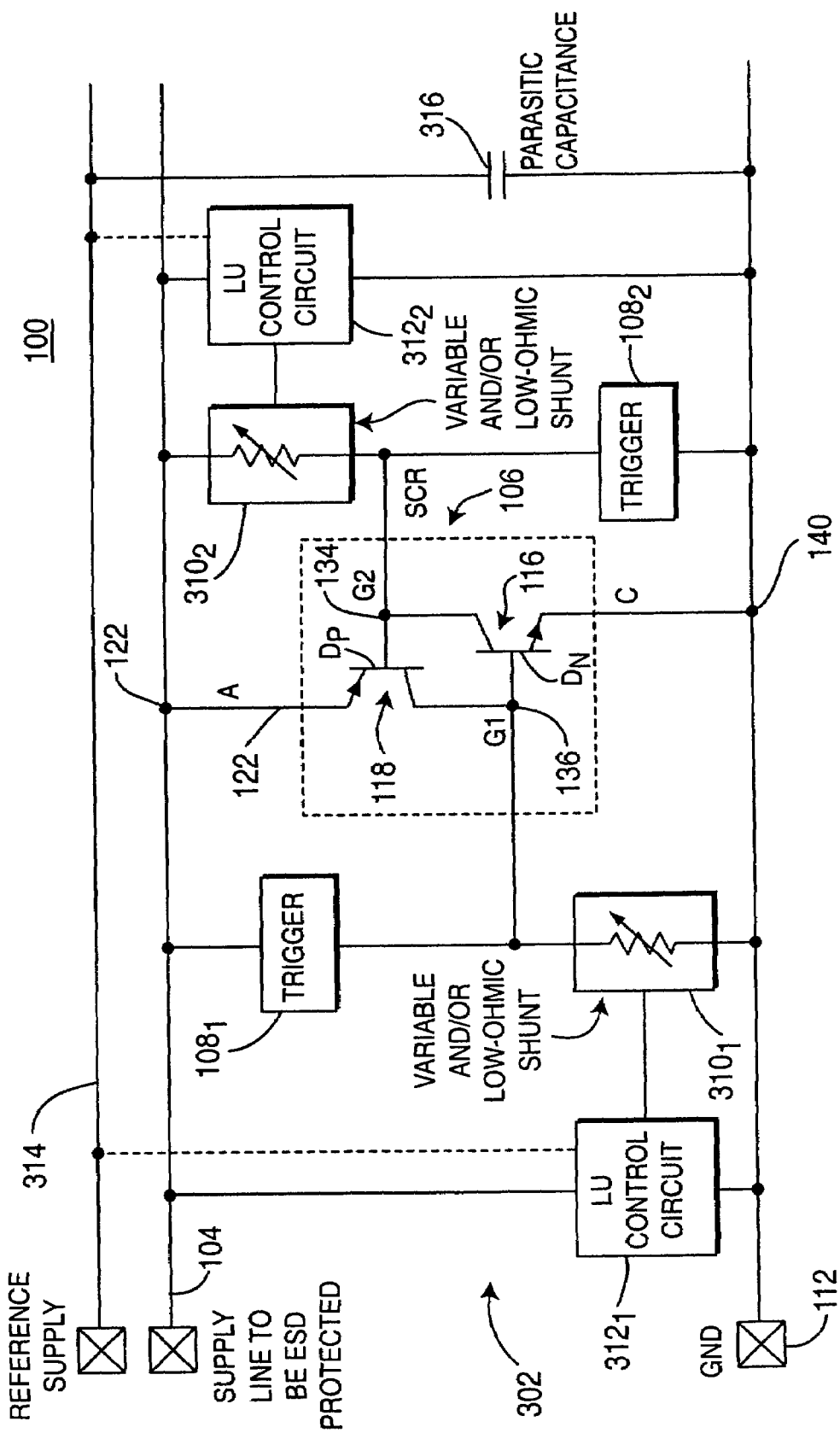
FIG. 3 depicts a schematic block diagram of the HHISCR protection device having an actively controlled latch-up circuit control.

FIG. 3 depicts a schematic block diagram of a second embodiment of the HHISCR protection device 302 having an actively controlled latch-up circuit 312. The configuration of the HHISCR protection device 302 is configured the same as the HHISCR protection device 102 of FIG. 1, except that the shunt resistors $310_1$ and $310_2$ are variable resistors. The variable shunt resistors 310 are fabricated from a three terminal semiconductor device (e.g., MOS device) having either linear or non-linear resistance characteristics.

Additionally, a first latch-up (LU) control circuit $312_1$ is coupled to the first variable shunt resistor device $310_1$. The latch-up control circuit $312_1$ is also coupled between the supply line to be protected 104 and ground 112. As will be discussed in further detail below, the latch-up control circuit 312 is designed to detect whether or not there is power on the supply line 104 to be protected, as well as adjust the triggering and holding currents above or below the latch-up current of the HHISCR protection device 302, depending on the operative state of the IC 100.

In an alternate embodiment where a reference supply line 314 is available, the latch-up control circuit $312_1$ is also coupled to the reference supply line 314, as drawn in phantom in FIG. 3. A parasitic capacitance 316, formed between the reference supply line 314 and ground 112, is used in conjunction with the latch-up control circuit 314 to detect whether the IC 100 is powered on or in an off state. It is noted that the protected supply line 104 may have a potential greater or less than the reference supply line 314, as is discussed in further detail below with regard to FIG. 8.

During normal operation with the IC 100 powered on, the latch-up control circuits 312 are coupled to the variable resistors 310, which couples the gates G1 136 and G2 134 of the SCR 106 to the respective supply lines. That is, gate G1 136 is coupled to ground 112 via low resistance variable resistor $310_1$, and gate G2 134 is coupled to the protected supply line 104 via a low resistance variable resistor $310_2$. The variable resistors 310 have a low resistance value between 0.1 and 10 ohms. As such, the triggering and holding currents are above the latch-up current of the SCR 106, as shown in FIG. 2.

During a non-powered condition the latch-up control circuits 312 are decoupled from ground 112 or the protection supply line 104 with the variable resistors 310 in a high resistive state, which decouples the gates G1 136 and G2 134 of the SCR 106 from the respective ground and supply lines. That is, gate G1 136 is only coupled to ground 112 via the high resistive P-substrate resistance $R_{sub}$ 130, while gate G2 134 is only coupled to the protected supply line 104 via the high resistive N-well resistance $R_{nwell}$ 132. The resistors 310 may be considered to have an effective high resistance value in a range approximately between 0.1–10 ohms (IC 100 powered) and above 1 gigaohms (IC non-powered). As such, the triggering and holding currents are below the latch-up current of the SCR 106, as shown in FIG. 2.

During an ESD event, the trigger device 108 will turn on and start conducting. Once the voltage across the variable shunt resistor 310, that is in parallel with the base-emitter diode $D_n$, reaches approximately 0.7 volts, the diodes $D_n$ and/or $D_p$ become forward biased. The AC-HHISCR 106 triggers and initiates the current regeneration process, thereby quickly shunting the ESD current to ground 112.

Figure 4:
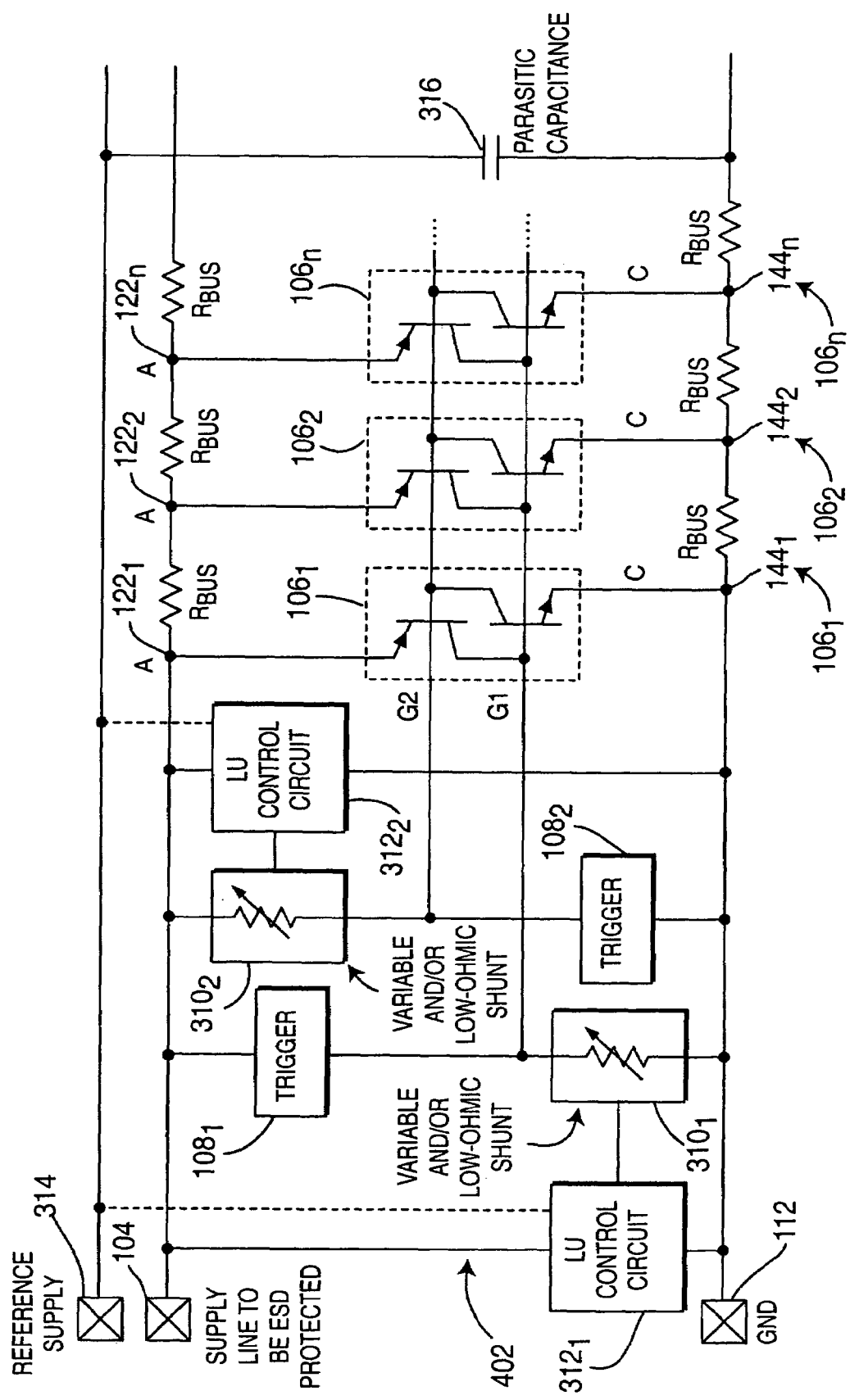
FIG. 4 depicts a schematic block diagram of the actively controlled HHISCR protection device of FIG. 3 having multiple SCR fingers.

FIG. 4 depicts a schematic block diagram of an actively controlled HHISCR protection device 402 having multiple SCR fingers 106. FIG. 4 is the same as the embodiment of FIG. 3, except that the trigger devices 108, variable shunt resistors 110, and latch-up control circuits may be used to provide triggering and holding currents above the latch-up currents for multiple SCR fingers $106_1$ through $106_n$ (where n is an integer greater than one). For a typical layout implementation of a multifinger SCR, including placement of trigger gates, the reader is directed to commonly assigned U.S. patent application Ser. No. 09/974,011, filed Oct. 10, 2001 by Sarnoff Corporation of Princeton, N.J., which is incorporated herein by reference in its entirety.

In particular, the multiple SCR fingers (e.g., $106_1$ to $106_n$) are coupled in parallel, where each respective anode 122 is coupled to the voltage supply line 104 to be protected, and each respective cathode 144 is coupled to ground 112. Each SCR finger 106 may be triggered by the trigger device 108 coupled to the first and/or second gates 136 and 134. FIG. 4 illustratively shows the necessary connections of the triggering devices 108, variable shunt resistors 310 and latch-up control circuits 312 for providing triggering and holding currents to each of the SCR fingers 106 at both the first and second gates 136 and 134. That is, the first trigger device $108_1$ is coupled to the voltage supply line 104 to be protected and each respective first gate 136 of each SCR finger 106. Further, the first variable shunt resistor $310_1$ is coupled to the first gate 136 and ground 112. As such, each gate of each SCR finger 106 shares a common trigger device 108, variable shunt resistor 310, and LU control circuit 312.

Similarly, the second trigger device $108_2$ is coupled to ground 112 and each respective second gate 134 of each SCR finger 106. Further, the second variable shunt resistor $310_2$ is coupled from ground 112 to the second gate 134. FIG. 4 also includes parasitic bus resistances $R_{bus}$ that exist on the supply line 104 and ground 112 or the IC 100. A person skilled in the art will easily recognize that the parasitic bus resistance may complicate triggering of multiple SCR fingers, as well as lead to local over-voltage conditions that may be harmful to the IC. Typical bus resistances are in the range from 0.1–10 ohms. Therefore, there is a need in the art for providing triggering to multiple ESD protection devices (here SCR fingers 106) that are placed on the IC 100.

The HHISCR protection device 402 works in a similar manner as described in regard to FIG. 3. During normal IC operation, the HHISCR protection device 402 will have a trigger current $I_{trig}$ and holding current $I_{h-op}$ above a specified latch-up current $I_{lu}$, as shown in FIG. 2. Moreover, the holding voltage of each SCR finger 106 is less than the supply line voltage VDD, however the circuit is made latch-up immune by the high holding current $I_{h-op}$. Additionally, during the non-powered off state of the IC 100, each SCR finger $106_1$ to $106_n$ (and as such, the HHISCR protection device 402) will trigger during an ESD event at a trigger current $I_{trig}$ below the latch-up current $I_{lu}$.

Figure 5:
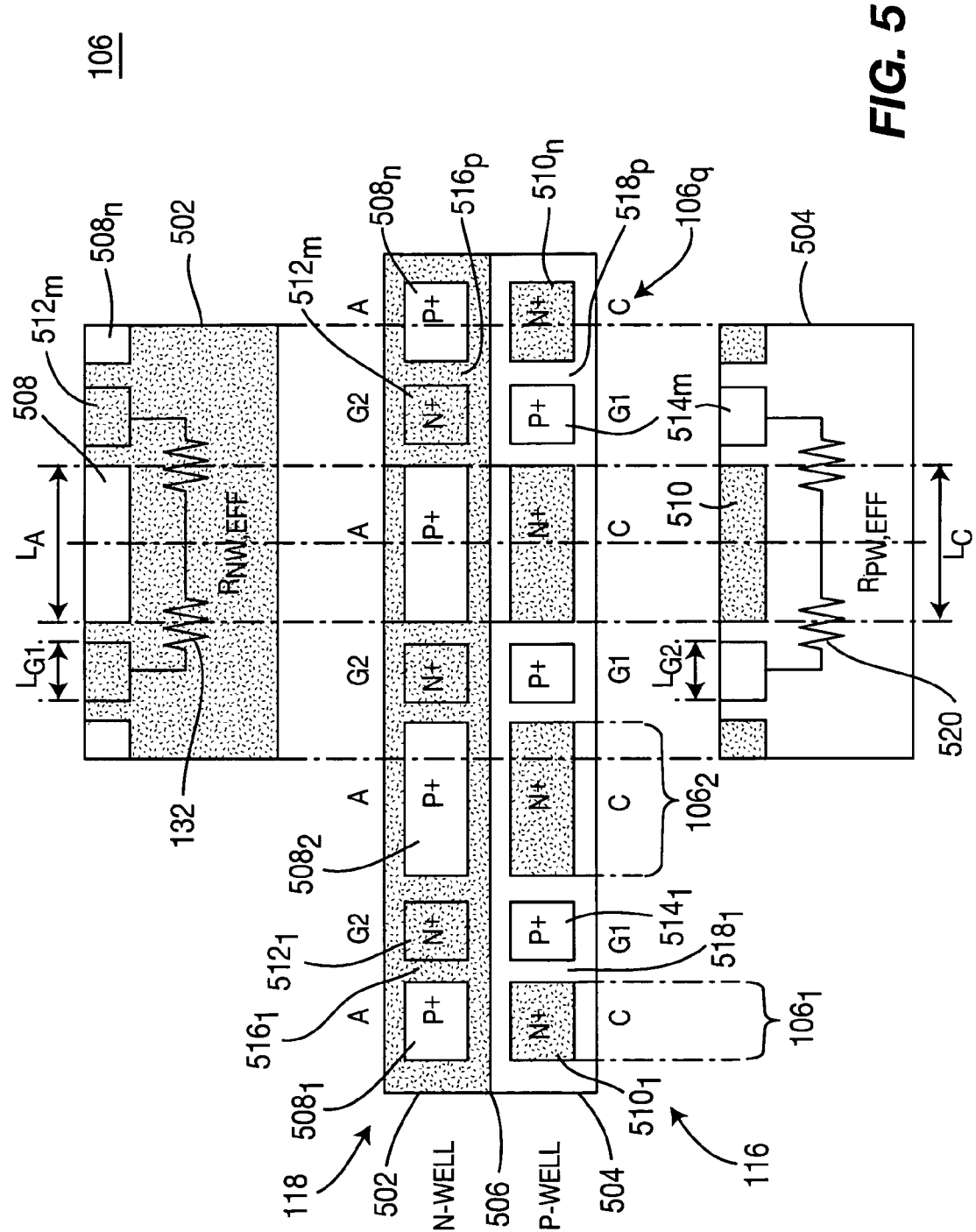
FIG. 5 depicts a top view layout and cross-sectional view of the HHISCR protection device of FIG. 1.

FIG. 5 depicts a top view layout and cross-sectional view of the HHISCR protection device 102 of FIG. 1. In particular, an N-well 502 and P-well 504 are formed adjacent to each other defining a junction 506 therebetween. The N-well 502 comprises a plurality of P+ doped regions $508_1$ through $508_n$ and a plurality of N+ doped regions $512_1$ through $512_m$, where a N+ doped region 512 is interspersed between adjacent P+ doped regions 508. For example, N+ region $512_1$ is positioned between P+ regions $508_1$ and $508_2$. Further, each high doped P+ and N+ doped region 508 and 512 is separated by a portion of the N-well 502, such as N-well portions $516_1$ and $516_p$, as shown in FIG. 5.

Similarly, the P-well 504 comprises a plurality of N+ doped regions $510_1$ through $510_n$ and a plurality of P+ doped regions $514_1$ through $514_m$, where a P+ doped region 514 is interspersed between adjacent N+ doped regions 510. For example, P+ region $514_1$ is positioned between N+ regions $510_1$ and $510_2$. Further, each high doped N+ and P+ doped region 510 and 514 are separated by a portion of the P-well 504, such as P-well portions $518_1$ and $518_p$, as shown in FIG. 5. The P+ and N+ doped regions 508 and 510, respectively with the proximate areas of the N-well and P-well regions 502 and 504, together form SCR slices $106_q$, where q is an integer greater than one. For example, P+ and N+ doped regions $508_1$ and $510_1$, respectively with the proximate areas of the N-well and P-well regions 502 and 504, together form a first SCR slice $106_1$, and so forth.

The PNP transistor 118 of the SCR 106 is formed by the P+ region 508, the N-well 502, and the P-well 504. Similarly, the NPN transistor 116 of the SCR 106 is formed by the N-well 502, the P-well 504, and the N+ region 510. As such, the P+ region 508 in the N-well 502 forms the anode 122, while the N+ region 510 in the P-well 504 forms the cathode 140 of the SCR 106. Furthermore, the N+ regions 512 dispersed in the N-well 502 form trigger taps of the second trigger gate 134, while the P+ regions 514 dispersed in the P-well 504 form trigger taps of the first trigger gate 136.

The length of each P+ region 508 and N+ region 510 is a determining factor for achieving trigger currents above the specified latch-up current of the SCR 106. In particular, a length $L_A$ of each P+ region 508 forming the anode 122 is equal to the length $L_C$ of each N+ region 510 forming the cathode 140. The actual lengths $L_A$ and $L_C$ of the P+ anode regions 508 and the N+ cathode regions 510 may vary according to the trigger and holding currents that are desired by the HHISCR protection device 102. In one embodiment, the lengths $L_A$ and $L_C$ of the P+ and N+ regions 508 and 510 are in a range of 0.16 to 10 micrometers. Furthermore, the lengths $L_{G1}$ and $L_{G2}$ of the respective P+ an N+ regions 514 and 512, which form the first and second trigger taps have lengths in the range of 0.2 to 2 micrometers.

It is noted that the lengths $L_A$ and $L_C$ of each P+ and N+ regions 508 and 510, affect the effective N-well resistance 132 and P-well resistance 520, respectively. Specifically, the effective resistances of the N-well 132 and P-well 520 may be reduced by decreasing the lengths $L_A$ and $L_C$ of the P+ and N+ regions 508 and 510, which function as the base regions of the PNP and NPN transistors 118 and 116, respectively.

It is also noted that reducing the lengths $L_A$ of the P+ regions 508 allows the adjacent trigger taps of the second gate G2 134 to be in closer proximity to each other. Likewise, reducing the lengths $L_C$ of the N+ regions 510 allows the adjacent trigger taps of the first gate G1 136 to be in closer proximity to each other. In one embodiment, the distance 516 between the P+ regions 508 and N+ regions 512 in the N-well 502 are between 0.12 and 1.2 micrometers. Likewise, the distance 518 between the N+ regions 510 and P+ regions 514 in the P-well 504 are between 0.12 and 1.2 micrometers. As such, the number and lengths $L_A$ and $L_C$ of the P+ and N+ doped regions 508 and 510, in relation to the interspersed trigger gate taps G1 136 and G2 134, affect the triggering and holding currents of the HHISCR device 102.

Additionally, the effective resistances of the N-well 502 and P-well 504 (bases of the PNP and NPN transistors 118 and 116) as determined by the respective doping concentration also influence the triggering and holding currents of the HHISCR device 102. By reducing the lengths $L_A$ and $L_C$ of the P+ and N+ doped regions 508 and 510, as well as the effective resistances of the N-well 502 and P-well 504, the triggering and holding currents are held above the specified latch-up current of the SCR 106, as shown in FIG. 2. Furthermore, by forming the SCR slices $106_q$, the lengths $L_A$ and $L_C$ may be substantially reduced without sacrificing ESD current protection, as opposed to other prior art devices where SCR slices are not provided. That is, simply reducing the lengths of the high-doped regions forming the SCR 106, without forming individual SCR slices $106_q$, degrades the overall performance of an SCR ESD protection device.

Figure 6:
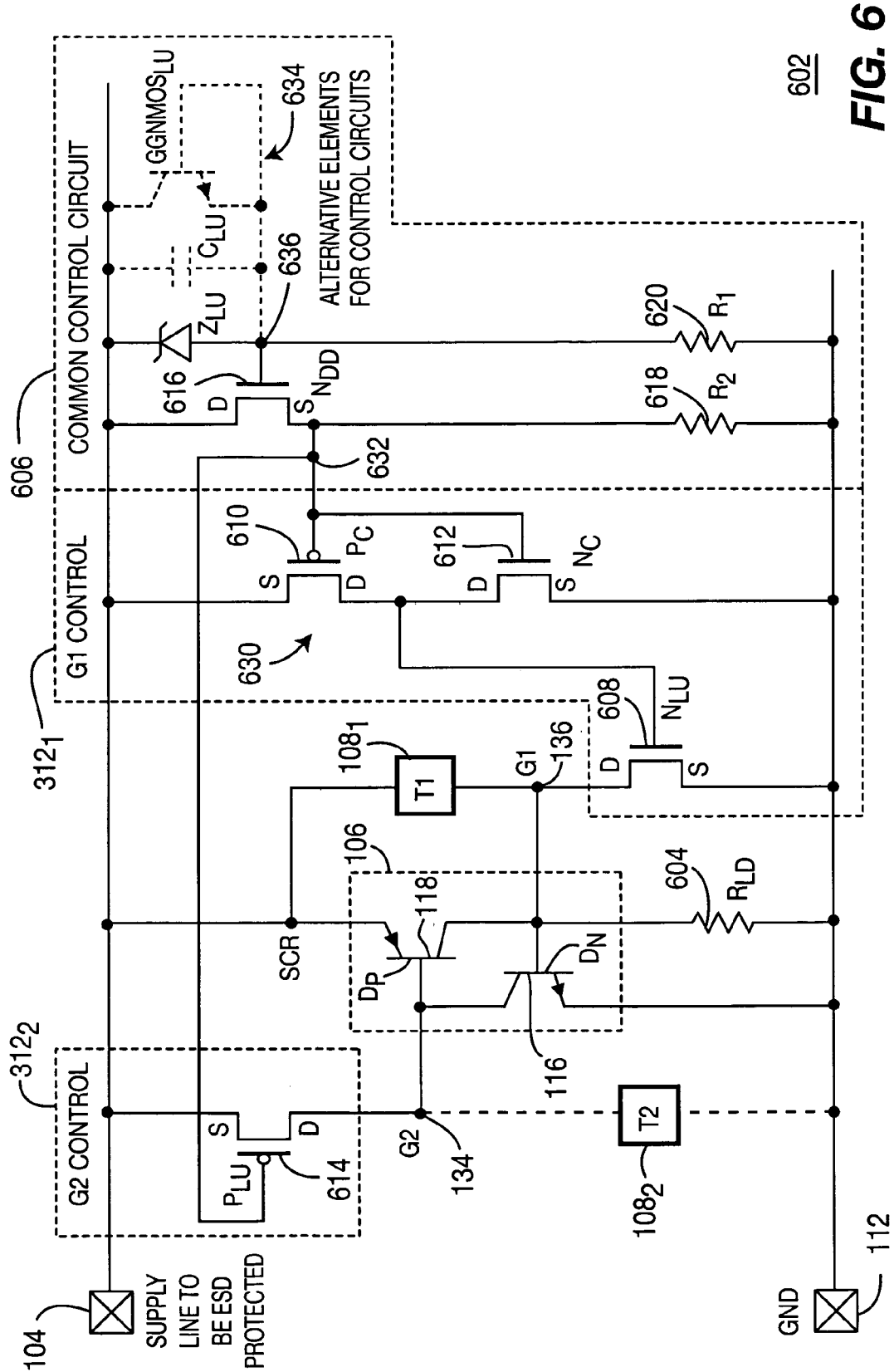
FIG. 6 depicts a detailed schematic diagram of a first embodiment of the actively controlled latch-up circuit and HHISCR of FIG. 3.

FIG. 6 depicts a detailed schematic diagram of a first embodiment of the actively controlled HHISCR ESD protection device 302 of FIG. 3. FIG. 6 should be viewed together with FIG. 3. The HHISCR ESD protection device 602 depicts a detailed schematic diagram of one embodiment of the latch-up control circuits 312 that are coupled to the SCR 106, as shown in the block diagram of FIG. 3. In particular, the HHISCR ESD protection device 602 comprises the SCR 106 having an equivalent resistor $R_{Id}$ 604 representing the parallel-coupled shunt resistor 110 (if present) and the inherent P-substrate resistance $R_{sub}$ 130, which are coupled between the first gate 136 and ground 112. The equivalent resistor $R_{Id}$ 604 has a resistance value of approximately 1 Kohm.

FIG. 6 illustratively shows the trigger devices 108 and the latch-up control circuits 312 for both SCR gates G1 and G2 136 and 134. The HHISCR ESD protection device 602 is used to provide a high triggering and holding current under normal IC operation (above the specified latch-up current). Conversely, the HHISCR ESD protection device 602 is used to provide a low triggering and holding current to facilitate easy triggering during an ESD event, when the IC 100 is in an off state, as shown in FIG. 2. The trigger and holding currents are below the specified latch-up current because the latch-up criterion is not applicable for an un-powered IC 100 during ESD.

In particular, the first latch-up control circuit $312_1$ comprises a NMOS transistor $N_{lu}$ 608 having its drain and source respectively coupled to the first gate 136 of the SCR 106 and to ground 112. The NMOS transistor 608 has a width between 50 and 1000 micrometers, which allows a large amount of drive current to pass through the NMOS transistor 608. The gate of the NMOS transistor 608 is coupled to an inverter stage 630. The inverter stage 630 comprises a PMOS transistor $P_c$ 610 serially coupled to an NMOS transistor $N_c$ 612. In particular, the source of the PMOS transistor 610 is coupled to the protected supply line 104, the drain of the PMOS transistor 610 is coupled to the drain of the NMOS transistor 612, and the source of the NMOS transistor 612 is coupled to ground 112. The gates of the PMOS and NMOS transistors 610 and 612 are coupled to a first node 632, which is coupled to a common control circuit 606.

In an instance where the second gate G2 134 is utilized to trigger the SCR 106, a PMOS transistor $P_{lu}$ 614 has its source and drain respectively coupled to the protected supply line 104 and to the second gate G2 134. The gate of the PMOS transistor $P_{lu}$ 614 is also coupled to the first node 632, which is coupled to the common control circuit 606.

The control circuit 606 comprises a NMOS transistor $N_{DD}$ 616, a first pulldown resistor R1 620, a second pulldown resistor R2 618, and a trigger device 634, such as a Zener diode $Z_{lu}$. The drain and source of the NMOS transistor 616 are respectively coupled to the protected supply line 104 and the first node 632. The second pulldown resistor R2 618 is coupled between the first node 632 and ground 112. The gate of the NMOS transistor $N_{DD}$ 616 is coupled to a second node 636, where the first pulldown resistor R1 is further coupled to ground 112. The trigger device 634 is coupled between the protected supply line 104 and the second node 634.

FIG. 6 illustratively shows a Zener diode $Z_{lu}$ coupled in the reverse conduction direction between the protected supply line 104 and the second node 634. Alternatively, a capacitor $C_{lu}$, or GGNMOS device may also be utilized as a trigger device 634. It is noted that the control circuit 606 is shared by both latch-up control circuits $312_1$ and $312_2$, and is required in any of the embodiments using either or both the first trigger gate 136 and/or the second trigger gate 134.

During normal IC operation, the triggering and holding currents are pulled higher than the latch-up current. Circuit analysis is performed with respect to the first trigger gate 136 of the SCR 106. Referring to the first latch-up control circuit $312_1$ and the control circuit 606 of FIG. 6, the protected supply line 104 is at a nominal potential (e.g., VDD). As such, the trigger device/voltage controller (e.g., Zener diode $Z_{lu}$) 634 is off, thereby the gate of the NMOS transistor $N_{dd}$ can be pulled to ground 112 via the first pulldown resistor R1 620, which turns the NMOS transistor $N_{dd}$ 616 off. Since the NMOS transistor $N_{dd}$ 616 is off, the gate of the PMOS transistor $P_c$ 610, at the first node 632, is pulled to ground 112 via the second pulldown resistor R2 618, thereby turning the PMOS transistor $P_c$ 610 on and the NMOS transistor $N_c$ 612 off. As such, the gate of the NMOS transistor $N_{lu}$ 608 has a potential greater than the source of the NMOS transistor $N_{lu}$ 608, which turns the NMOS transistor $N_{lu}$ 608 on. Once the NMOS transistor $N_{lu}$ 608 is turned on, the NMOS transistor $N_{lu}$ 608 acts as a low resistance shunt (e.g., 0.1–10 ohms), with respect to the parallel resistor $R_{ld}$ (1 Kohm). In particular, first trigger gate 136 is pulled to ground 112, thereby increasing the triggering and holding current of the SCR 106 during normal (powered) operation of the IC 100. In fact, the triggering $I_{trig}$ and holding currents $I_{hold}$ are above the latch-up current $I_{lu}$, as shown by curve 212 of FIG. 2.

During an ESD event when the IC 100 is not powered, an over-voltage condition occurring at the protected supply line 104, causes the exemplary Zener diode $Z_{lu}$ 634 to breakdown and conduct. The Zener diode $Z_{lu}$ 637 causes a voltage drop across the pulldown resistor R1 and pulls the gate of NMOS transistor $N_{dd}$ high, thereby turning the NMOS transistor $N_{dd}$ 616 on. The first node 632 is also pulled high because of a voltage drop across the pulldown resistor R2, which turns the PMOS transistor $P_c$ 610 off. It is noted that in order to switch the PMOS transistor $P_c$ 610 entirely off, the gate potential must be higher than the potential of the supply line 104, less the threshold voltage (e.g., 0.2–0.7 volts) of the PMOS transistor $P_c$ 610. Accordingly, the pulldown resistor R2 618 must have a sufficiently high resistance (e.g., 10 Kohm) compared to the resistance of the NMOS transistor $N_{dd}$ 616. Thus, most of the voltage drop occurs across the pulldown resistor R2 618.

Pulling the gate of the NMOS transistor $N_{lu}$ 608 to ground 112, turns the NMOS transistor $N_{lu}$ 608 off. Once the NMOS transistor $N_{lu}$ 608 is off, the resistor $R_{ld}$ 604 (i.e., P-substrate resistance 128, and optionally the parallel shunt resistor 110 of FIG. 1) is coupled between the first trigger gate 136 and ground 112. As such, the SCR 106 will trigger when the voltage across the trigger device T1 $108_1$ produces current flow through the resistor $R_{ld}$ 604 and the voltage across the resistor $R_{ld}$ 604 rises to approximately 0.7 volts, which forward biases the base-emitter diode $D_n$ of the NPN transistor 116. The current regeneration process of the SCR 106 begins and causes the SCR 106 to shunt the ESD current to ground 112. It is important to note that the high resistance of the effective resistor $R_{ld}$ 604 causes the triggering current $I_{trig}$ and holding current $I_{hold}$ during to be lower than the latch-up current $I_{lu}$, as shown by curve 214 of FIG. 2.

A similar analysis may be performed when the second gate 134 is utilized to trigger the SCR 106. In particular, during normal operation (i.e., the IC 100 is powered up), the gate of the PMOS transistor $P_{lu}$ 614 is low, thereby turning the PMOS transistor $P_{lu}$ 614 on, which pulls the second gate 134 to the high potential of the protected supply line 104. Increasing the voltage at the second gate G2 134 increases the triggering current $I_{trig}$ and holding current $I_{hold}$ of the SCR 106 above the latch-up current $I_{lu}$, as shown by curve 212 of FIG. 2.

Alternately, during a non-powered state of the IC 100, the gate of the PMOS transistor $P_{lu}$ 614 is high, which turns the PMOS transistor $P_{lu}$ 614 off. As such, the second gate G2 134 is floating, which lowers the triggering current $I_{trig}$ and holding current $I_{hold}$ of the SCR 106 below the latch-up current $I_{lu}$, as shown by curve 214 of FIG. 2. Triggering during an ESD event by the second trigger device $108_2$ pulls the trigger gate G2 134 lower, causing a voltage drop across the emitter-base diode $D_p$ of the PNP transistor 118 and starting the regenerative conduction in the SCR 106.

It is readily seen that the latch-up control circuits 312 utilize the exemplary NMOS and PMOS transistors 608 and 614, in conjunction with the intrinsic resistance $R_{sub}$ 130, optional shunt resistors 110, and N-well resistor 132, to provide the effective resistance of the variable shunt resistors 310, as shown in FIGS. 3, 4, and 6. It is noted that the RC delay with respect to the first pulldown resistor R1 620 and the capacitor $C_{LU}$ must be at least in the order of magnitude of the rise time of the ESD pulse, since the latch-up control circuit 312 needs to be inactive during SCR triggering (i.e. consequently node 636 is pulled high during the rising edge of the ESD pulse, and the latch-up control devices 312 are in off mode). After the SCR "latches" into high current operation, the gates of the SCR 106 have minor impact on SCR operation, such that renewed activation of the latch-up control devices 312 has no influence on the function of the ESD protection. It is further noted that alternative embodiments of the common control circuit 606 may also be utilized, as illustratively discussed with regard to FIG. 7 below.

Figure 7:
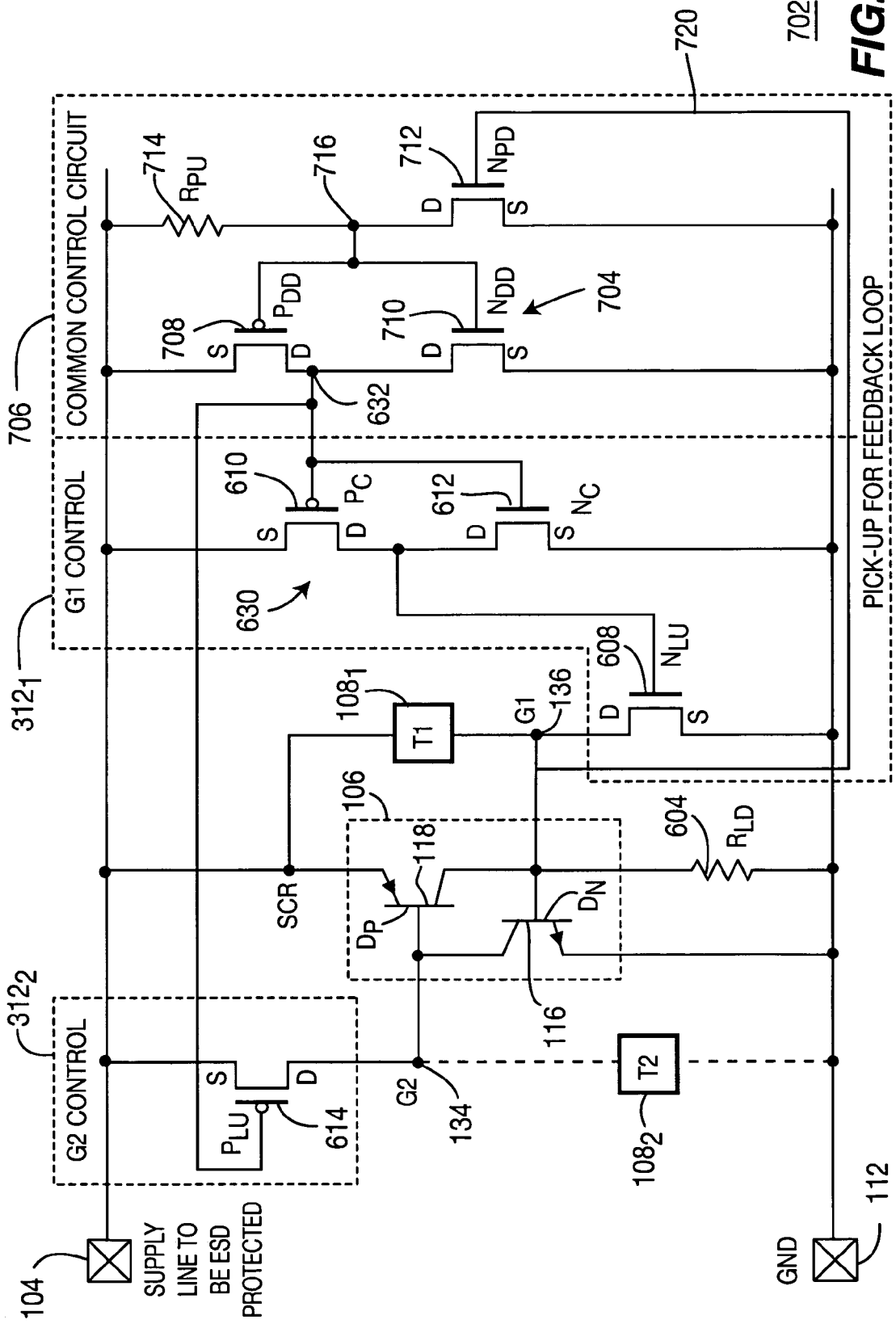
FIG. 7 depicts a detailed schematic diagram of a second embodiment of the actively controlled HHISCR ESD protection device of FIG. 3.

FIG. 7 depicts a detailed schematic diagram of a second embodiment of the actively controlled HHISCR ESD protection device 302 of FIG. 3. FIG. 7 should be viewed along with FIGS. 3 and 6. FIG. 7 is the same as FIG. 6, except for the shared control circuit 606 of FIG. 6.

Referring to FIG. 7, the control circuit 706 comprises a second inverter circuit 704, which has a PMOS transistor $P_{dd}$ 708 and an NMOS transistor $N_{dd}$ 704, a pull-up resistor $R_{pu}$ 714, and a pull-down NMOS transistor $N_{pd}$ 712. The source and drain of the PMOS transistor $P_{dd}$ 708 are respectively coupled to the protected supply line 104 and the drain of the NMOS transistor $N_{dd}$ 704. The source of the NMOS transistor $N_{dd}$ 704 is coupled to ground 112, and the gates of the NMOS transistor $N_{dd}$ 704 and the PMOS transistor $P_{dd}$ 708 are coupled to a second node 716. The pull-up resistor $R_{pu}$ 714 is coupled between the protected power line 104 and the second node 716. The pull-down NMOS transistor $N_{pd}$ 712 is coupled between the second node 716 and ground 112, while the gate of the pull-down NMOS transistor $N_{pd}$ 712 is coupled to the first gate G1 136 of the SCR 106 via feedback loop 720.

Circuit analysis is performed with respect to the first trigger gate G1 136 of the SCR 106. In particular, during normal IC operation, the triggering and holding currents are pulled higher than the latch-up current. Referring to the first latch-up control circuit $312_1$, and the control circuit 706 of FIG. 7, the protected supply line 104 is at a nominal potential (e.g., VDD). The gate of the pull-down NMOS transistor $N_{pd}$ 712, which is coupled to the first trigger gate G1 136 of the SCR 106, is low because the first trigger gate G1 136 is coupled to ground via the resistor $R_{LD}$ 604 and the SCR 106 is off. The NMOS transistor $N_{pd}$ 712 is off and the gates of the NMOS transistor $N_{dd}$ 708 and the PMOS transistor $P_{dd}$ 704 at the second node 716 are pulled high by the pull-up resistor $R_{PU}$ 714, thereby turning the NMOS transistor $N_{dd}$ 708 on, and turning the PMOS transistor $P_{dd}$ 704 off. The first node 632 is then pulled low to ground 112, via the NMOS transistor $N_{dd}$ 708.

A low potential at the first node 632 turns the NMOS transistor $N_c$ 612 off, and turns the PMOS transistor $P_c$ 610 on. Once the PMOS transistor $P_c$ 610 is turned on, the gate of the NMOS transistor $N_{lu}$ 608 is pulled high, which turns the NMOS transistor $N_{lu}$ 608 on. As such, the NMOS transistor $N_{lu}$ 608 acts as a low resistance shunt (0.1–10 ohms), with respect to the parallel resistor $R_{ld}$ (1 Kohm). In particular, first trigger gate 136 is pulled to ground 112, thereby increasing the triggering and holding current of the SCR 106 during normal (powered) operation of the IC 100. In fact, the triggering current $I_{trig}$ and holding current $I_{hold}$ are above the latch-up current $I_{lu}$, as shown by curve 212 of FIG. 2.

During an ESD event when the IC 100 is not powered, an over-voltage condition occurs at the protected supply line 104, which causes the first trigger device $108_1$ to start to conduct at the trigger voltage and current will flow through NMOS transistor $N_{LU}$ and the resistor $R_{LD}$ to ground. In particular, the substrate potential rises (e.g., a few 100 millivolts) and this potential at the first gate G1 136 is fed back, via a feedback line 720, to the gate of the pull-down NMOS transistor $N_{pd}$ 712. Once the substrate potential exceeds the threshold voltage (0.2–0.7 volts) of the pull-down NMOS transistor $N_{pd}$ 712, the NMOS transistor $N_{pd}$ turns on and pulls the voltage potential at the second node 716 to ground 112. A low potential at the second node 716 turns the NMOS transistor $N_{dd}$ 704 off, and turns the PMOS transistor $P_{dd}$ 708 on.

Once the PMOS transistor $P_{dd}$ 708 is turned on, the first node 632 is pulled high to the protected supply line 104. The PMOS transistor $P_c$ 610 is then turned off and the NMOS transistor $N_c$ 612 is turned on, thereby pulling the gate of the NMOS transistor $N_{lu}$ 608 to ground 112 and turning off the NMOS transistor $N_{lu}$ 608. Once the NMOS transistor $N_{lu}$ 608 is off, then only the resistor $R_{ld}$ 604 is coupled between the first trigger gate 136 and ground 112. Therefore, a much larger portion of the current from the trigger device $108_1$ is now fed into the trigger gate G1 136 of the SCR for further turn-on. That is, the SCR 106 will trigger when the voltage across the resistor $R_{ld}$ 604 rises to approximately 0.7 volts, which forward biases the base-emitter diode $D_n$ of the NPN transistor 116. The forward biasing of the base-emitter diode $D_n$ begins the current regeneration of the SCR 106 to shunt the ESD current.

It is important to note that the triggering current $I_{trig}$ and holding current $I_{hold}$ during the non-powered state is lower than the latch-up current, as shown by curve 214 of FIG. 2. It is further noted that a similar analysis may also be performed when the second gate 134 is utilized to trigger the SCR 106. The advantage of this embodiment 702 of the invention over the version 602 is that no initial trigger device 634 (FIG. 6) is required. Triggering of the SCR 106 is now solely controlled by the already present trigger device 108.

Figure 8:
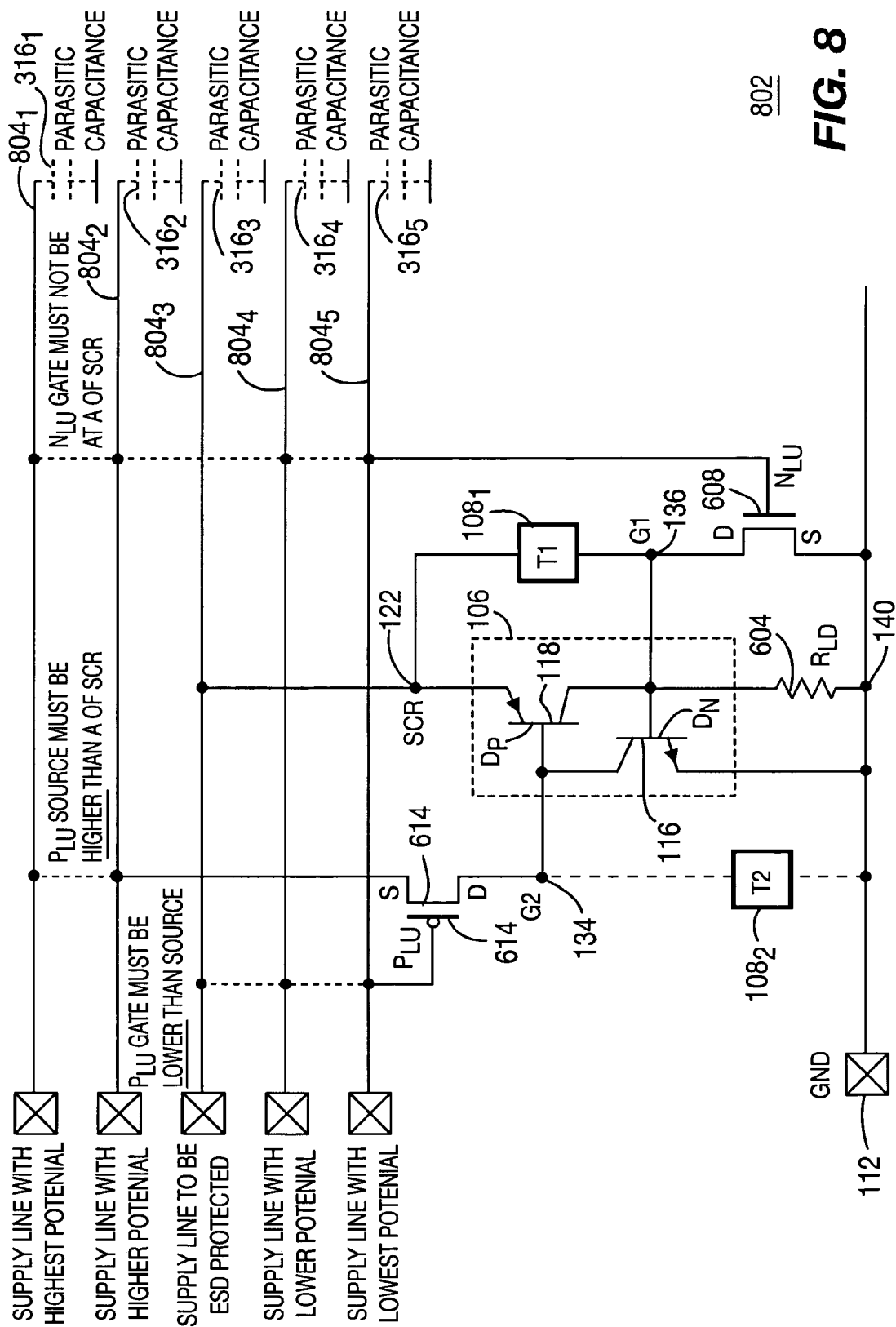
FIG. 8 depicts a schematic drawing of the actively controlled HHISCR ESD protection device of FIG. 1 for protecting multiple supply lines.

FIG. 8 depicts a schematic drawing of an actively controlled HHISCR ESD protection device 802 for protecting multiple supply lines 804. The multiple supply lines 804 have varying voltage potentials ranging from a highest potential supply line $804_1$, to a lowest potential supply line $804_s$. In FIG. 8 the protected supply line is illustratively shown as the third supply line $804_3$ of the multiple supply lines 804. A person skilled in the art will understand that an actively controlled HHISCR ESD protection device 802 is preferably used for each supply line 804 on the IC 100.

The ESD protection device 802 comprises the SCR 106 having its anode 122 coupled to the protected supply line (e.g., $804_3$) and cathode 140 coupled to ground 112. The first trigger device $108_1$ is coupled between the anode 122 of the SCR 106 and the first trigger gate 136. The second triggering device $108_2$ is coupled between the second trigger gate G2 134 and ground 112. The resistor $R_{ld}$ 604 is coupled in parallel with base-emitter diode $D_n$ of the NPN transistor 118, between the first trigger gate G1 136 and ground 112, as discussed with regard to FIG. 6. However, as discussed above, the circuitry to be protected of the IC 100 dictates which of the triggering gates of the AC-HHISCR ESD protection device 802 are to be used.

It is also noted that parasitic capacitances $316_1$ through $316_s$ (collectively parasitic capacitance 316 drawn in phantom) are formed between each supply line $804_1$ through $804_s$ (including the protected supply line $804_3$) and ground 112. The parasitic capacitances 316 are formed on the IC 100 and are utilized to distinguish if the IC 100 is in a non-powered state (i.e., off) or in a power state (i.e. on).

The NMOS transistor $N_{lu}$ 608 is also coupled in parallel with the base-emitter diode $D_n$ of the NPN transistor 118 and the load resistor $R_{ld}$ 604. In particular, the drain and source of the NMOS transistor $N_{lu}$ 608 are respectively coupled to the first trigger gate G1 136, and to ground 112. The gate of the NMOS transistor $N_{lu}$ 608 is coupled to a reference supply line 804 other than the protected supply line 104, as is discussed in further detail below.

The drain of the PMOS transistor $P_{lu}$ 614 is coupled to the second trigger gate G2 134. The source of the PMOS transistor $P_{lu}$ 614 is coupled to a reference supply line 804 having a potential greater than the protected supply line 104. The gate of the PMOS transistor $P_{lu}$ 614 is coupled to a reference supply line 804 that has a potential lower than the source of the PMOS transistor $P_{lu}$ 614, as is discussed in further detail below.

The schematic drawing of FIG. 8 shows various techniques for protecting each of the supply lines 804 from an ESD event. When the first trigger gate G1 136 is used to trigger the SCR 106, the gate of the NMOS transistor $N_{lu}$ 608 cannot be coupled to the protected supply line (e.g., $804_3$). Coupling to a reference supply line having the same potential as the protected supply line $804_3$ is permissible, however, it must be a separate supply line. That is, a different "power domain" must not be connected on-chip to the same supply.

During normal IC operation, the triggering and holding currents are higher than the specified latch-up current. Circuit analysis is performed with respect to the first trigger gate 136 of the SCR 106. In particular, when the IC 100 is powered, the parasitic capacitances 316 between the supply lines 804 are charged up. As such, the gate of the NMOS transistor $N_{lu}$ 608 is pulled high to the potential of the reference supply 804, thereby turning the NMOS transistor $N_{lu}$ 608 on.

Once the NMOS transistor $N_{lu}$ 608 is on, the NMOS transistor $N_{lu}$ 608 acts as a low resistive shunt path in parallel with the resistance $R_{ld}$ 604, which pulls the first trigger gate G1 136 to ground 112. Grounding the first trigger gate G1 136 increases the triggering and holding current of the SCR 106 during normal (powered) operation of the IC 100. In fact, the triggering $I_{trig}$ and holding currents $I_{hold}$ are above the latch-up current $I_{lu}$, as shown by curve 212 of FIG. 2. It is noted that the NMOS transistor $N_{lu}$ 608 is most efficiently turned on when the gate of the NMOS transistor $N_{lu}$ 608 is coupled to the highest possible supply potential (e.g., supply line $804_1$).

When the IC 100 is not powered, the parasitic capacitances 316 between each supply lines 804 and ground 112 are not charged. As such, the gate of the NMOS transistor $N_{lu}$ 608 is capacitively pulled low to ground 112, and the NMOS transistor $N_{lu}$ 608 is turned off. As such, the SCR 106 will start conduction during an ESD event at the supply line $804_3$ at the desired low trigger and holding currents, and the SCR 106 will shunt the ESD current to ground 112. It is important to note that the triggering current $I_{trig}$ and holding current $I_{hold}$ during the non-powered state is lower than the latch-up current $I_{lu}$, as shown by curve 214 of FIG. 2.

Similar circuit analysis may be made in the instances where the second trigger gate G2 134 and PMOS transistor $P_{lu}$ 614 are alternately used either singularly or in conjunction with the first trigger gate G1 136. However, there are certain conditions that must be met to enable protection of the protected supply line when utilizing the second trigger gate G2 134. In particular, the source of the PMOS transistor $P_{lu}$ 614 must be at a higher potential than the protected supply line (e.g., $804_3$), and is most efficient when connected to the highest reference supply line available (e.g., supply line $804_1$). That is, the source of the PMOS transistor $P_{lu}$ 614 must be at a higher potential than the anode 122 of the SCR 106. Additionally, the gate of the PMOS transistor $P_{lu}$ 614 must be at a potential lower than the source of the PMOS transistor $P_{lu}$ 614, and is most efficient when connected to the lowest reference supply line available (e.g., supply line $804_5$). One objective is to obtain, by the largest possible voltage difference between source and gate, the highest possible drive current in the PMOS device 614 and therefore the highest possible trigger and holding current of the SCR 106. It is further noted that the PMOS transistor $P_{lu}$ 614 may not be used to protect the supply line having the highest potential (e.g., $804_1$).

When the IC 100 is powered, the parasitic capacitances 316 between the supply lines 804 are charged up. As such, the gate of the PMOS transistor $P_{lu}$ 614 is pulled lower than the source, thereby turning the PMOS transistor $P_{lu}$ 614 on. Once the PMOS transistor $P_{lu}$ 614 is on, the PMOS transistor $P_{lu}$ 614 acts as low resistive connection of the trigger gate G2 134 to a high supply voltage potential. Connecting the second trigger gate G2 134 high increases the triggering and holding current of the SCR 106 during normal (powered) operation of the IC 100. In fact, the triggering $I_{trig}$ and holding currents $I_{hold}$ are above the latch-up current $I_{lu}$, as shown by curve 212 of FIG. 2.

When the IC 100 is not powered, the parasitic capacitances 316 between the supply lines 804 are not charged. In particular, the gate and the source of the PMOS transistor $P_{lu}$ 614 are pulled capacitively to ground 112, thereby turning the PMOS transistor $P_{lu}$ 614 off. Once the PMOS transistor $P_{lu}$ 614 is off, the second trigger gate G2 134 can now be considered floating. As such, the second trigger gate G2 134 is pulled low after triggering of the second trigger element $108_2$. The PMOS transistor $P_{LU}$ off decreases the triggering and holding current of the SCR 106 during an ESD event to the desired low values. In fact, the triggering $I_{trig}$ and holding currents $I_{hold}$ are below the latch-up current $I_{lu}$, as shown by curve 214 of FIG. 2.

Figure 9:
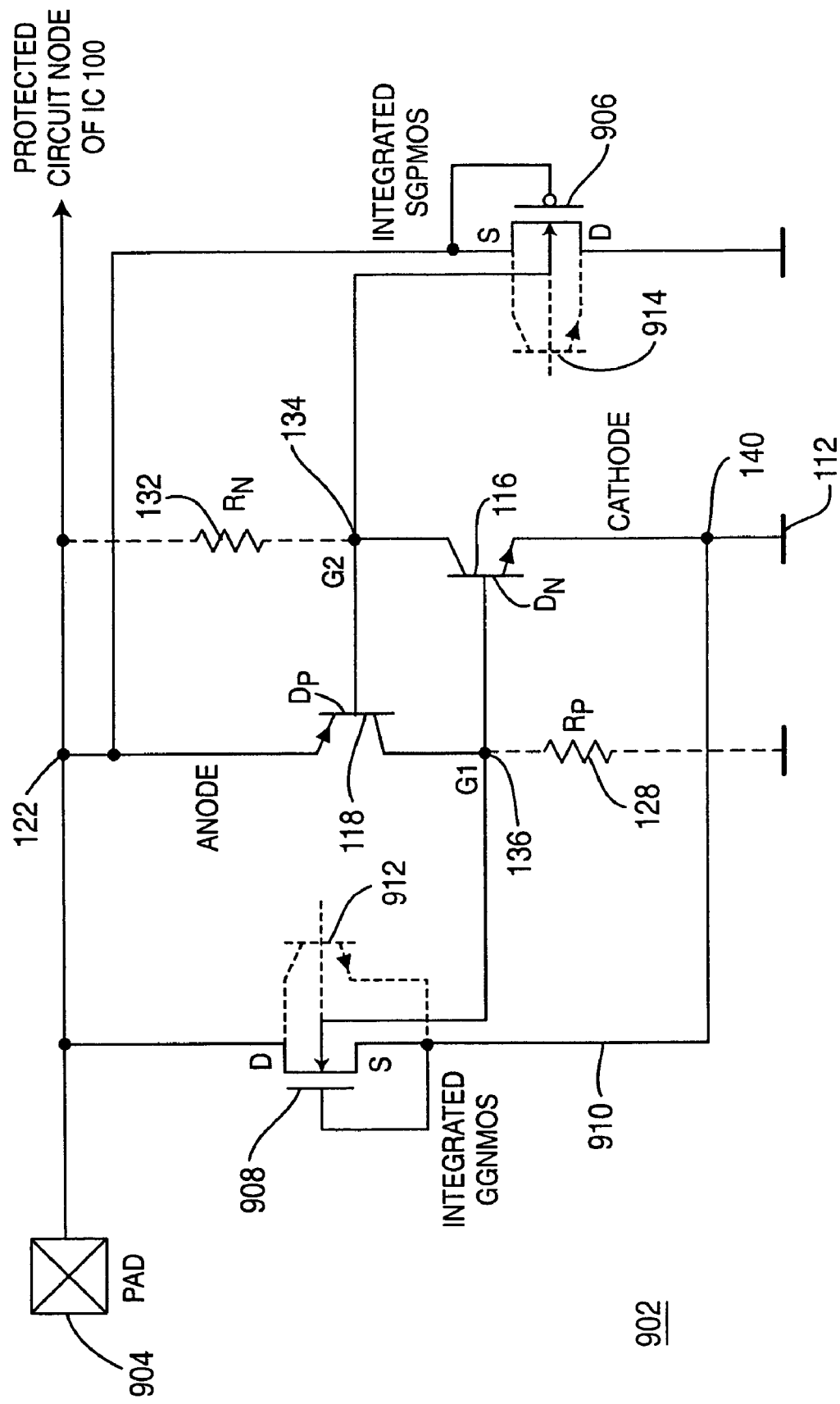
FIG. 9 depicts a schematic diagram of a high-speed HHISCR ESD protection device having substrate and well trigger coupling.

FIG. 9 depicts a schematic diagram of a high-speed HHISCR ESD protection device 902 having substrate and well trigger coupling. In particular, the HHISCR 106 is illustratively shown having the anode 122 coupled to a pad 104 of the protected circuitry of the IC 100. The cathode 140 of the HHISCR 106 is coupled to ground 112. The intrinsic P-substrate and/or P-well resistances $R_p$ 128 of the NPN transistor 116 is coupled between the first trigger gate G1 136 and ground 112, while the N-well resistance $R_n$ 132 of the PNP transistor 118 is coupled between the anode 122 and the second trigger gate G2 134.

An NMOS transistor 908 is coupled to the first trigger gate G1 136. In particular, the drain of the NMOS transistor 908 is coupled to the anode 122, and the source is coupled to the grounded cathode 140. The gate of the NMOS transistor 908 is grounded, thereby forming a grounded gate NMOS (GGNMOS) device. The substrate of the NMOS transistor 908 is also coupled between the first trigger gate G1 136 and ground via substrate resistor $R_p$ 128.

Similarly, a PMOS transistor 906 is coupled to the second trigger gate G2 134. In particular, the source of the PMOS transistor 906 is coupled to the anode 122, and the drain is coupled to the grounded cathode 140. The gate of the PMOS transistor 906 is coupled to the anode 122 forming a source gate connected PMOS (SGPMOS). The N-well of the PMOS transistor 906 is also coupled to the second trigger gate G2 134 and the anode 122 via N-well resistor $R_n$ 132. As will be shown and discussed below with regard to FIGS. 10 and 11, the NMOS and PMOS transistors 908 and 906 are integrated with the HHISCR 106.

The embodiment of FIG. 9 is considered a high-speed HHISCR ESD protection device because the GGNMOS transistor 908 and the SGPMOS 906 are connected in parallel with the anode 122 and the cathode 112 of the SCR 106, while the substrate of the GGNMOS 908 and the N-well of the SGPMOS 906 are coupled to the trigger gate G1 136 and G2 134 of the SCR 106, respectively. Recall that in the embodiments of FIGS. 1–8, a low resistance shunt resistor $110_1$ was used to couple the trigger device $108_1$ to ground 112, while the layout of the HHISCR featured multiple N+/G1 and N+/G2 trigger taps of the SCR 106 to have a very good control for a low substrate potential/high N-well potential. Recall that in FIG. 5, the lengths $L_A$ and $L_C$ are important for high trigger and holding currents. Additional reasons for the high-speed characteristics are discussed below with regard to FIGS. 10 and 11.

In particular, the SCR 106 is turned on by a combination of triggering of the GGNMOS 908 and/or the SGPMOS 906, while the GGNMOS 908 has typically a slightly lower trigger voltage than the SGPMOS 906 because of technological reasons known in the art. Once the GGNMOS 908 and/or SGPMOS 906 is triggering (i.e. in breakdown+ triggering of the parasitic bipolar transistor 912 and 914), the local substrate potential of the GGNMOS 908 will increase (+0.7V) and/or the local well potential of the SGPMOS 906 will decrease (wherever it was −0.7V).

Specifically, a parasitic bipolar transistor 912 is formed by the GGNMOS transistor 908, where the collector is formed by the drain, the emitter is formed by the source, and the base is formed by the local substrate/p-well of the GGNMOS transistor 908. The potential at the base of the parasitic bipolar transistor 912 is applied to the first gate G1 136 of the SCR 106. Once the parasitic bipolar transistor 912 turns on, and once the potential across the P-substrate resistance $R_p$ 128 increases to approximately 0.7 volts, the base-emitter diode $D_n$ is forward biased, which turns on the SCR 106.

Similarly, a parasitic bipolar transistor 914 is formed by the SGPMOS transistor 906, where the collector is formed by the drain, the emitter is formed by the source, and the base is formed by the N-well of the SGPMOS transistor 906. The potential at the base of the parasitic bipolar transistor 914 is applied to the second gate G2 134 of the SCR 106. Once the parasitic bipolar transistor 914 turns on and when the potential across the N-well resistance $R_n$ 132 decreases approximately 0.7 volts from the potential at the anode 122, the emitter-base diode $D_p$ is forward biased, which turns on the SCR 106.

As such, three parallel current paths are formed between the pad 904 and ground 112. First, the GGNMOS trigger device 908, second, the SGPMOS trigger device 906, and third, the SCR 106 itself. The first two paths through the GGNMOS and SGPMOS devices 908 and 906 initially conduct the transient current (e.g., 1–2 amps) during the first few nanoseconds of the ESD event. Furthermore, the first two paths act as the triggering elements for the HHISCR 106. Once the HHISCR 106 triggers, the HHISCR 106 forms a large current shunt from the protected supply line 904 (or pad) to ground 112, as compared to the first two paths.

Figure 10:
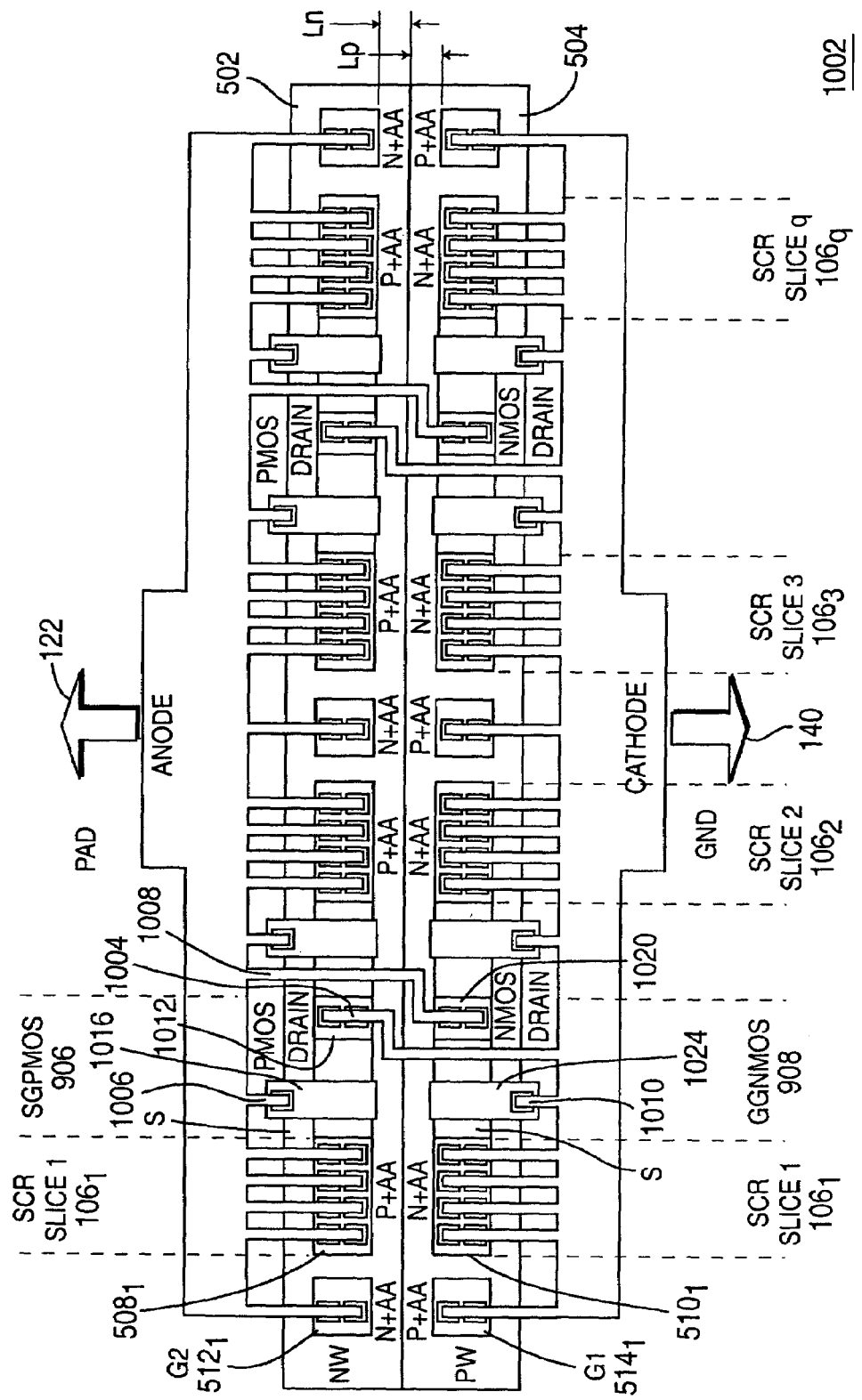
FIG. 10 depicts a top view layout of a first embodiment the HHISCR protection device of FIG. 9.

FIG. 10 depicts a top view layout of a first embodiment the HHISCR protection device of FIG. 9. FIG. 10 should be viewed in conjunction with FIGS. 5 and 9. In particular, FIG. 10 is the same as the top view layout shown in FIG. 5, except that the GGNMOS transistor 908 and SGPMOS transistor 906 are additionally integrated with the SCR 106. In particular, the SCR 106 is formed into SCR slices $106_1$ through $106_q$, as discussed above with regard to FIG. 5.

The SGPMOS and GGNMOS transistors 906 and 908 are apportioned and integrated with each slice $106_q$. For example, a portion of the P+ doped region $508_1$ in the N-well 502 forms the emitter of the PNP transistor 118, as well as the source of the SGPMOS transistor 906, which are coupled to the anode 122. The drain of the SGPMOS transistor 906 is formed in a second P+ doped region 1012 in the N-well 502 and is connected to the cathode 140 via metallic path 1004. The gate 1016 of the SGPMOS transistor 906 is formed between and perpendicular to the P+ doped region 508 second P+ doped region 1012, and is coupled to the anode 122 via path 1006.

Similarly, a portion of the N+ doped region 510, in the P-well 504 forms the emitter of the NPN transistor 116, as well as the source of the GGNMOS transistor 908 which is coupled to the cathode 140. The drain of the GGNMOS transistor 908 is formed in a second N+ doped region 1020 in the P-well 504, and is connected to the anode 122 via metallic path 1008. The gate 1024 of the GGNMOS transistor 908 is formed between and perpendicular to the N+ doped region 510 and second N+ region 1020, and is coupled to the cathode 140 via path 1010.

In one embodiment, the gates of the SGPMOS and GGNMOS transistors 906 and 908 are fabricated from polysilicon. It is also noted that the high-speed performance of the HHISCR protection device 902 is achieved by integrating the MOS devices 906 and 908 with the SCR slices $106_1$ through $106_q$. As such, the MOS transistors 906 and 908 initially conduct current, as described with regard to FIG. 9, and quickly trigger the SCR 106, because of the shared arrangements described above. It is further noted that the intrinsic ESD hardness of the GGNMOS 908 and SGPMOS 906 may be increased by providing local silicide blocking during fabrication. A person skilled in the art will understand the layout techniques to apply the silicide blocking.

Moreover, the triggering and holding currents are adjusted above the latch-up current during normal IC operation, as discussed in regard to the previous embodiments of the HHISCR (i.e., FIGS. 3–9) and curve 212 of FIG. 2. In particular, the layout technique about the lengths $L_A$ and $L_C$, as well as the frequency and placement of the trigger taps for G1 and G2, as discussed in FIG. 5, is again the key to the triggering and holding voltage adjustment. Furthermore, as with any other SCR, but most importantly for this high speed HHISCR, it is also critical to provide minimum dimensions Ln and Lp (see FIG. 10) to obtain an intrinsically fast turning-on SCR.

Figure 11:
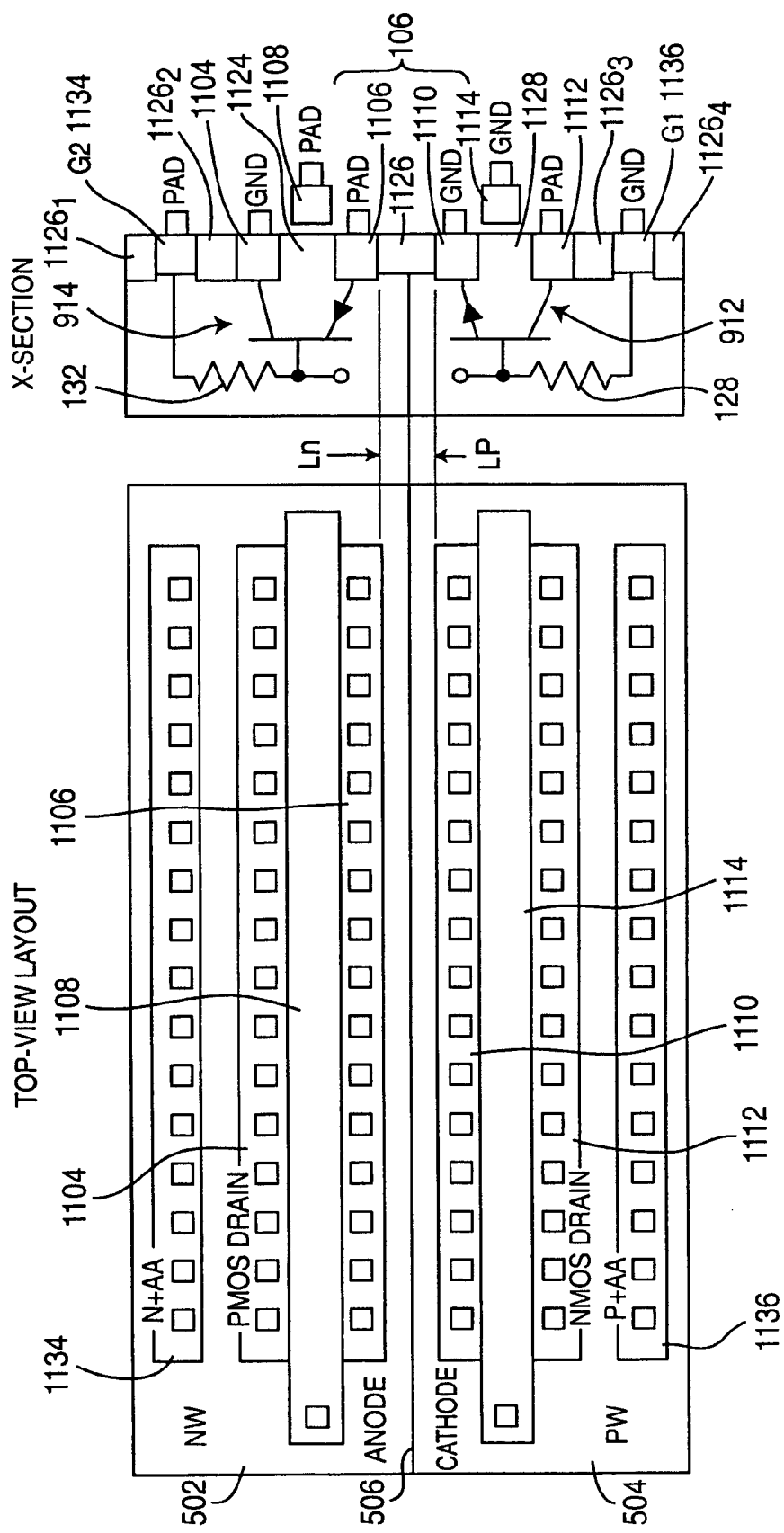
FIG. 11 depicts a top view layout of a second embodiment the HHISCR protection device of FIG. 9.

FIG. 11 depicts a top view layout of a second embodiment the HHISCR protection device of FIG. 9. FIG. 11 should be viewed in conjunction with FIG. 9. In particular, the SCR 106 is formed by a first P+ doped region 1106, the N-well 502, the P-well 504, and a first N+ doped region 1110. In particular, the PNP transistor 118 is formed by the P+ doped region 1106, the N-well 502, and the P-well 504. Similarly, the NPN transistor 116 is formed by the N-well 502, the P-well 504, and the N+ doped region 1110. The first P+ region 1106 also forms the anode 122, which is coupled to the pad 904. Similarly, the first N+ region also forms the cathode 140, which is coupled to ground 112.

The first trigger gate G1 136 is formed by a second P+ doped region 1136, while the second trigger gate G2 134 is formed by a second N+ doped region 1134. The SGPMOS transistor 906 (FIG. 9) is formed by a third P+ doped region 1104, the first P+ doped region 1106, and a gate 1108. Specifically, the third P+ doped region 1104 forms the drain of the SGPMOS transistor 906, which is coupled to ground 112. The first P+ doped region 1106, which is also the emitter of the PNP transistor 118 of the SCR 106, forms the source of the SGPMOS transistor 906.

Similarly, the GGNMOS transistor 908 (FIG. 9) is formed by a third N+ doped region 1112, the first N+ doped region 1110, and a gate 1114. Specifically, the third N+ doped region 1112 forms the drain of the GGNMOS transistor 908, which is coupled to the pad 904. The first N+ doped region 1110, which is also the emitter of the NPN transistor 116 of the SCR 106, forms the source of the GGNMOS transistor 908.

It is noted that the parasitic bipolar transistor 914 of the SGPMOS transistor 906 is formed by the first P+ doped region 1106 (emitter), the N-well 502 (base), and the third P+ region 1104 (collector). The N-well resistance $R_N$ 132 are formed by the N-well 502 base resistance. Similarly, the parasitic bipolar transistor 912 of the GGNMOS transistor 908 is formed by the first N+ doped region 1110 (emitter), the P-well 504 (base) and the third N+ region 1112 (collector). The P-well resistance $R_p$ 128 is formed by the P-well 504 base resistance.

In this second embodiment of FIG. 11, all the high doped N+ and P+ doped regions (i.e., regions 1134, 1104, 1106, 1110, 1112, and 1136) are formed in parallel with each other. Thus, the second embodiment of FIG. 11 differs from the first embodiment of FIG. 10, since there are no SCR slices $106_q$, rather a single SCR 106 and respective MOS triggering devices 108 are formed by the parallel running high doped regions. Further, the gates (1108 and 1114) of the MOS trigger devices 108 also run parallel to the source and drain regions of the SCR 106 and each MOS device 906 and 908, rather than perpendicular, as previously shown in FIG. 10.

As discussed above, the MOS trigger devices 906 and 908 are integrated with the SCR 106. As such, the MOS transistors 906 and 908 initially conduct current, as described with regard to FIG. 9, and quickly trigger the SCR 106, because of the shared arrangements described above. It is further noted that the intrinsic ESD hardness of the GGNMOS 908 and SGPMOS 906 may be increased by providing local silicide blocking.

It is further noted that the N-well resistance $R_n$ 132 and P-well resistance $R_p$ 128 may be further reduced by locating the respective trigger taps proximate to the drains of the MOS devices. In particular, the second N+ region 1134, which forms the second gate G2 134 of the SCR 106 is located in parallel and proximate the second P+ region 1104, which forms the drain of the SGPMOS transistor 906. Likewise, the second P+ region 1136, which forms the first gate G1 136 is located in parallel and proximate the second N+ region 1112, which forms the drain of the GGNMOS transistor 908.

Furthermore, as with any other SCR, but most importantly for this high speed HHISCR, it is also critical to provide minimum dimensions Ln and Lp (see FIG. 11) to obtain an intrinsically fast turning-on SCR. In particular, the anode 1106 and cathode 1110 regions of the HHISCR are formed (e.g., facing each other) as determined by the manner in which the MOS devices 906 and 908 are implemented, connected, and combined with the HHISCR. Moreover, it is well understood that a functional HHISCR of this second embodiment of FIG. 11 may still be provided by removing one of the two MOS devices 906 or 908. In particular, either of the gates 1108 or 1114 and a respective drain region 1106 or 1110 of the SGPMOS or GGNMOS may optionally be removed.

Figure 12:
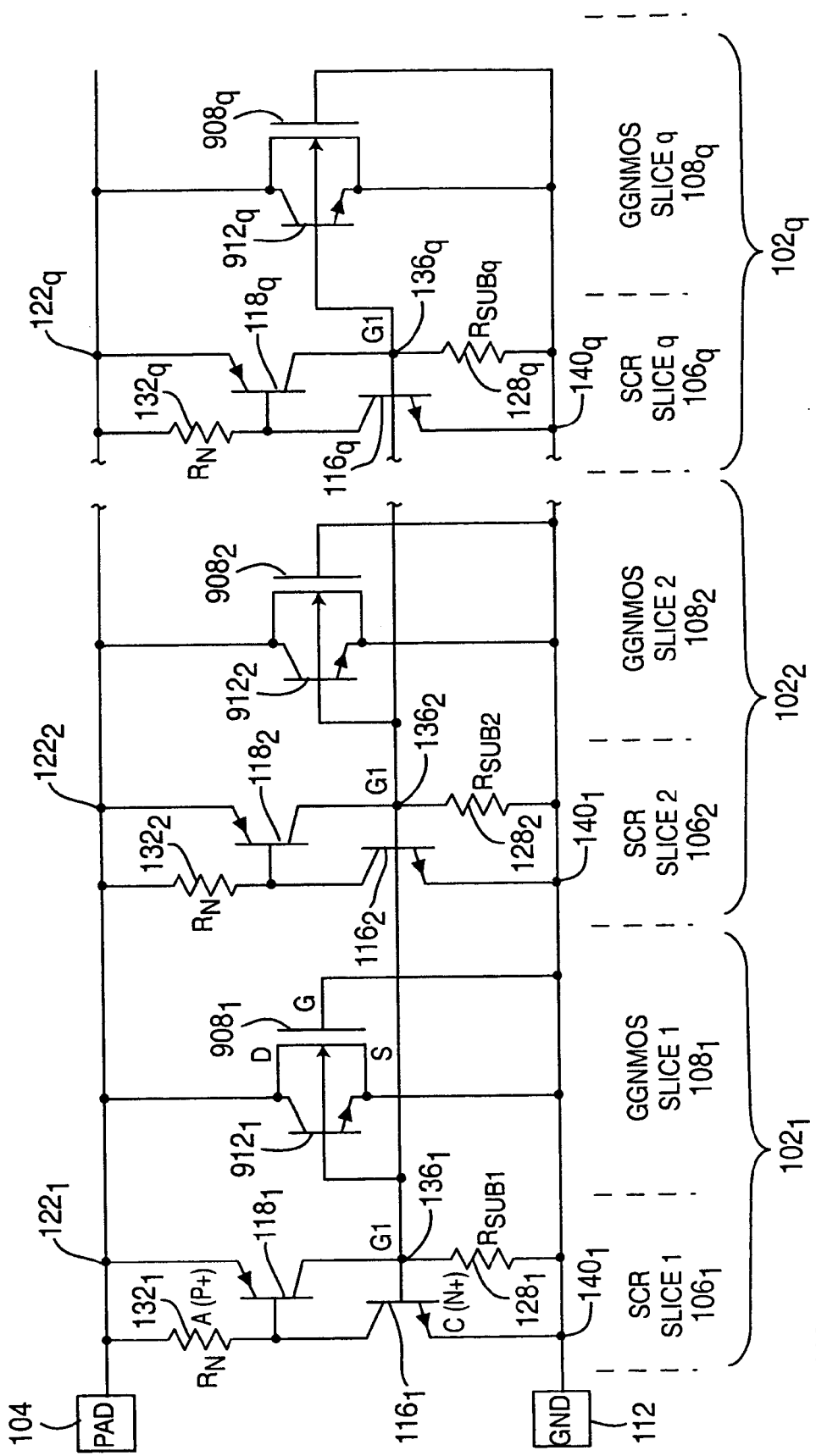
FIG. 12 depicts a schematic diagram of a hybrid HHISCR protection device having a plurality of HHISCR ESD protection device slices.

FIG. 12 depicts a schematic diagram of a hybrid HHISCR protection device 1202 having a plurality of HHISCR ESD protection device slices $102_1$ through $102_q$. Each HHISCR slice 102 comprises an SCR slice (e.g., $106_1$ through $106_q$) and a GGNMOS device slice (e.g., $108_1$ through $108_q$), which are integrated together. That is, HHISCR SCR slice $102_1$ comprises SCR slice $106_1$ and GGNMOS device slice $108_1$, and so forth.

More specifically, an exemplary first SCR slice 106, comprises an NPN and PNP transistor $116_1$, and $118_1$, a N-well resistor $R_n$ $132_1$, and a P-substrate resistor $R_p$ $128_1$, as discussed above with regard to FIG. 9. A first GGNMOS slice $108_1$ comprises a GGNMOS transistor $908_1$ and a parasitic bipolar transistor $912_1$. The GGNMOS transistor $908_1$ has the drain coupled to the anode $122_1$, and the gate and source coupled to the grounded cathode 140, as also shown in the embodiment of FIG. 9. Similarly, the parasitic bipolar transistor $912_1$ has the collector and emitter respectively coupled to the drain and source (anode $122_1$ and cathode $140_1$) of the first GGNMOS transistor $908_1$.

The base of the parasitic bipolar transistor $912_1$ is coupled to the first trigger gate G1 $136_1$. The same coupling of circuit elements is applied to the other HHISCR protection device slices $102_2$ through $102_q$. As such, all the bases of the parasitic bipolar transistors $912_1$ through $912_q$ of the GGNMOS trigger slices $108_1$ through $108_q$ are coupled to the first gate G1 136. Thus, each slice 102 operates in the same manner as described above regarding the GGNMOS transistor 908 and SCR 106 of the protection device 902 of FIG. 9.

Figure 13:
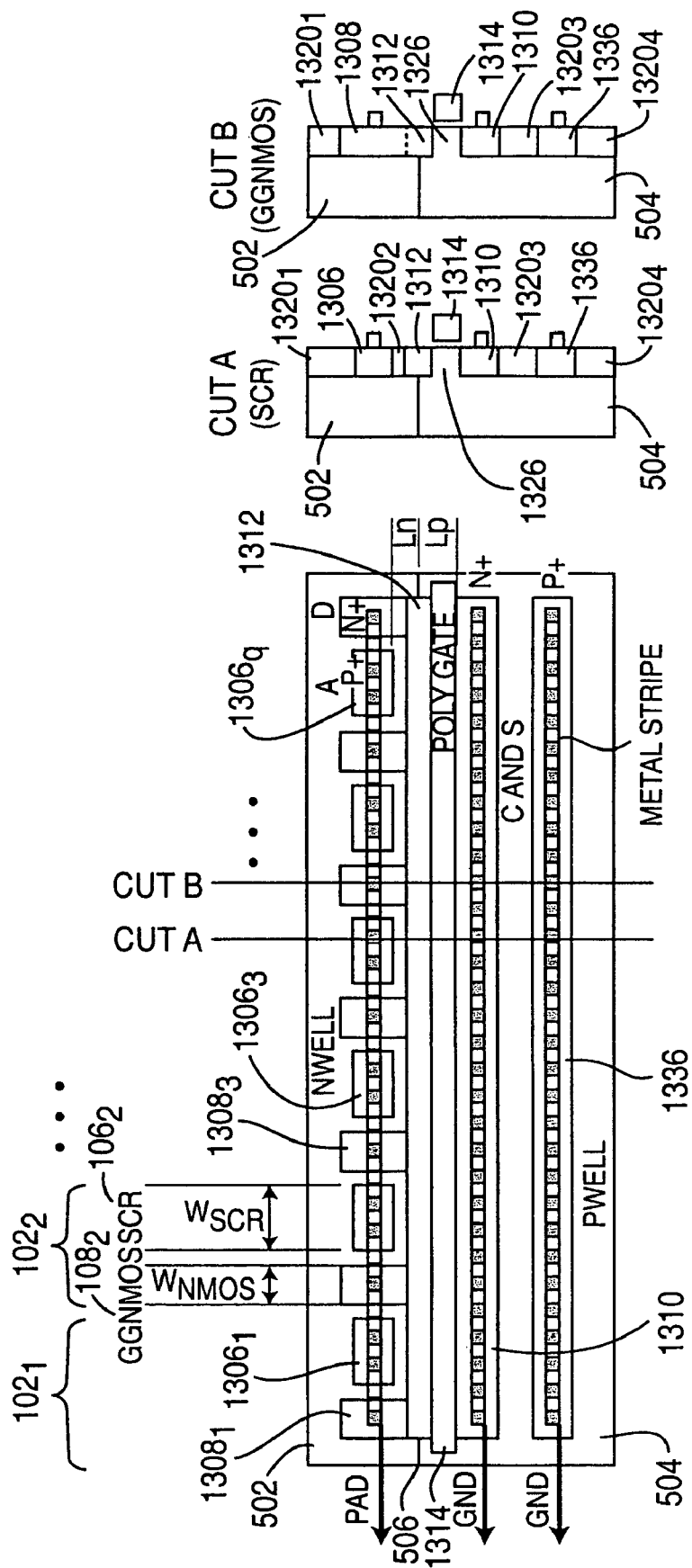
FIGS. 13–16 depict a top view and respective cross-section layouts of various embodiments of the hybrid HHISCR protection device of FIG. 12.

FIGS. 13–16 depict a top view and respective cross-section layouts of various embodiments of the hybrid HHISCR protection device of FIG. 12. FIG. 13 depicts a first layout embodiment of an ESD protection device 1302. FIG. 13 should be viewed along with FIG. 12. In particular, an N-well 502 and P-well 504 are provided adjacent to each other and form a junction 506 therebetween, as discussed with regard to FIG. 5. A first plurality of P+ regions $1306_1$ through $1306_q$ is interposed in the N-well 502. Additionally, a first plurality of N+ regions 1308, through $1308_q$ is respectively interspersed in the N-well 502, between each of the first plurality of P+ regions $1306_1$ through $1306_q$.

Each first interspersed P+ region 1306 and each first interspersed N+ region 1308 form part of an SCR slice 106 and a GGMOS slice 108. Specifically, each first P+ region 1306 forms the emitter (anode 122) of the PNP transistor 118. Furthermore, each first interspersed N+ region 1308 forms the drain of the GGNMOS 908, as well as the collector of the parasitic transistor 912.

A second N+ region 1312 extends over a portion of the N-well 502 and P-well 504 (i.e., junction 506) to couple the drains of each GGNMOS 908. The second N+ region 1312 is coupled to each of the first plurality of interspersed N+ regions 1308, such that the first P+ regions $1306_1$ through $1306_q$ are surrounded on two opposing sides by the first plurality of first N+ regions 1308 and a third side by the second N+ region 1312.

A polysilicon gate region 1314 is disposed over a portion 1326 of the P-well 504. A third N+ region 1310 is disposed in the P-well 504, such that a portion 1326 of the P-well 504 is disposed over the polysilicon gate region 1314 over a portion 1326 of the P-well 504. The third N+ region 1310 forms the emitter of the NPN transistor 116 (cathode 140) of the SCR 106, as well source of the GGNMOS transistor 908 and emitter of the parasitic transistor 912.

A second P+ region 1336 is also formed in the P-well 504 to form the first trigger gate 136. It is noted that the gate region 1314, third N+ region 1310, and second P+ region 1336 are parallel to each other and are common (i.e., shared) to all the ESD protection device slices 102. Furthermore, shallow trench isolation (STI) regions 1320 are respectively formed over the N-well and P-well regions 502 and 504 and between the first plurality of P+ and N+ regions 1306 and 1308, the second and third N+ regions 1312 and 1310, and the second P+ region 1336.

The drain region of the GGNMOS transistor 980 serves dual purposes. First, each portion of the drain (i.e., second N+ region 1312) over the P-well 504 serves as an integrated trigger device. Secondly, the drain (i.e., second N+ region 1312) serves as an N-well tie coupled from the N-well to the pad 104, which provides high trigger and holding currents. Additionally, the GGNMOS transistor 908 positioned between the pad 104 and ground 112 provides an initial path for grounding ESD current, prior to the SCR 106 triggering.

Figure 14:
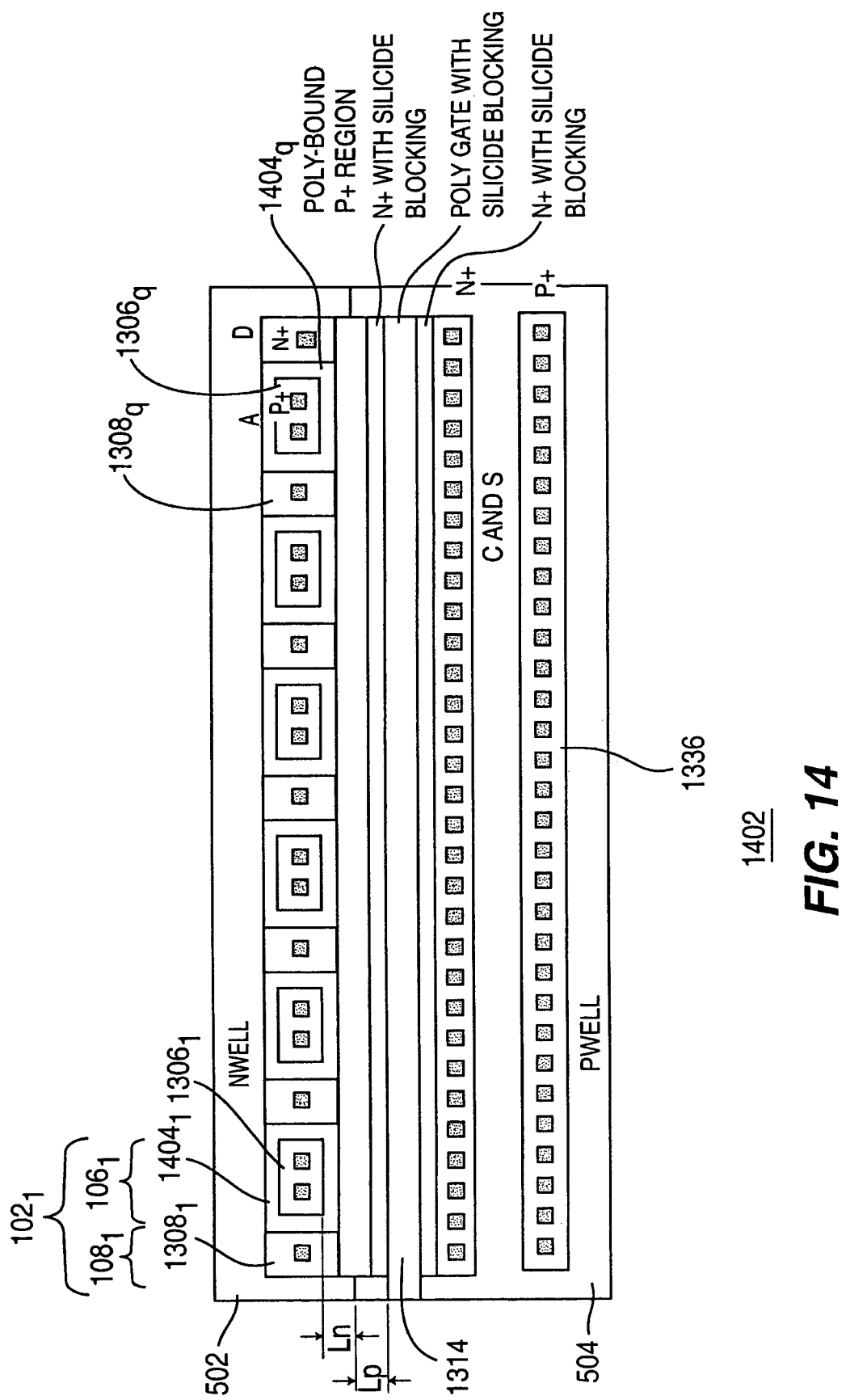

FIG. 14 depicts a second layout embodiment of an ESD protection device 1402, and FIG. 14 should be viewed along with FIG. 12. The second embodiment of FIG. 14 is the same as the first embodiment of FIG. 13, except that a plurality of interspersed polysilicon layers $1404_1$ through $1404_q$ is formed between the interspersed first P+ regions $1306_q$ and first N+ regions 1308. In particular, each first P+ region 1306 (anode 122 of the SCR 106) is surrounded (e.g., on four sides) by the polysilicon layer. Providing the polysilicon layers 1404 allows for greater cross-section for the current flow. Specifically, the polysilicon layers 1404 are formed over the N-well 502, as opposed to STI, which cuts into the N-well and reduces the cross-sectional area. Additionally, the second and third N+ regions 1312 and 1310, as well as the gate region 1314 are silicide blocked to improve the intrinsic ESD hardness of the GGNMOS slices 108.

Figure 15:
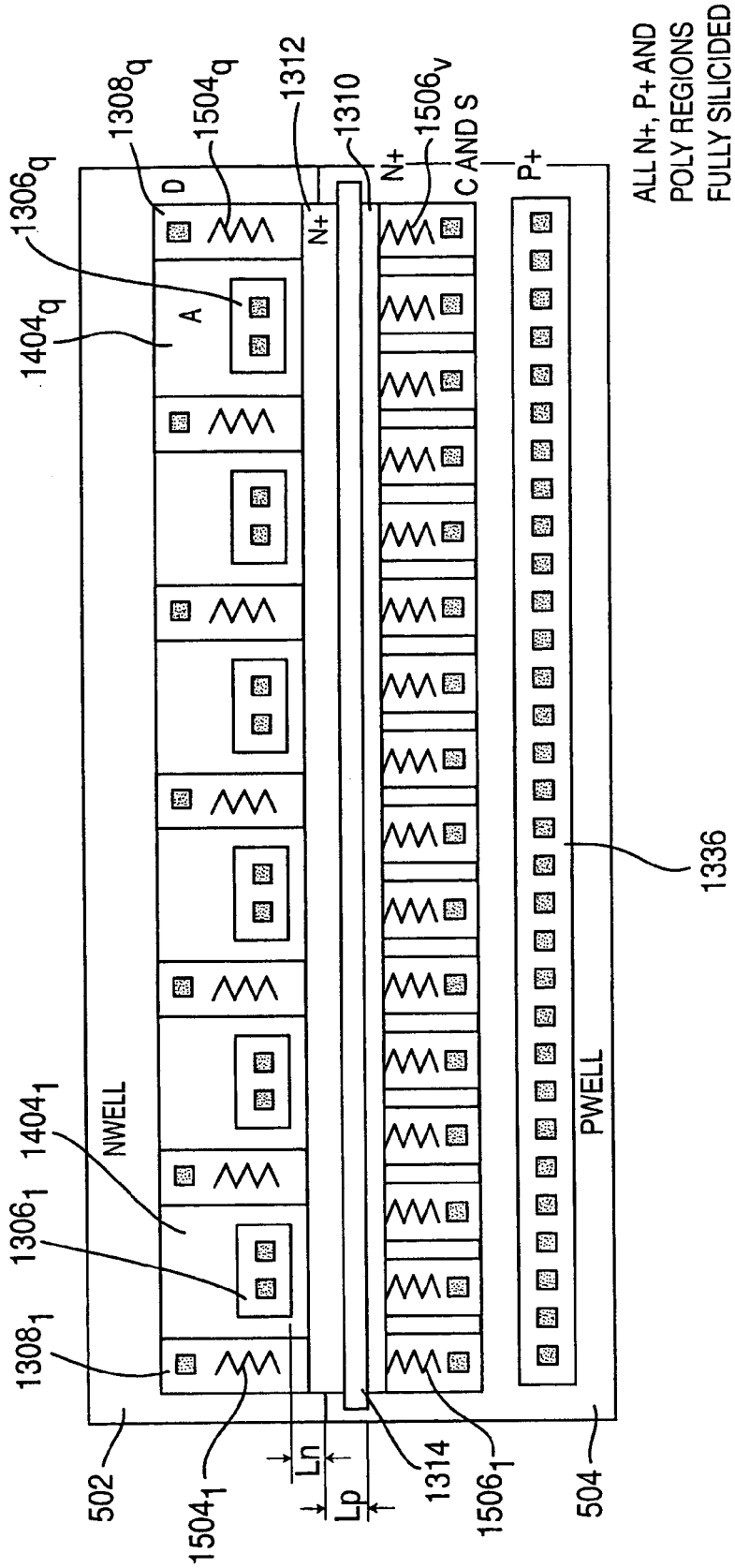

FIG. 15 depicts a third layout embodiment of an ESD protection device 1502, and FIG. 15 should be viewed along with FIG. 12. The third embodiment of FIG. 15 is the same as the first embodiment of FIG. 13, except that all the N+ regions, P+ regions, and polysilicon regions, are fully silicided. Furthermore, FIG. 15 depicts the respective ballasting resistances 1504 (illustratively shown as ballast resistors $1504_1$ through $1504_q$) in each of the first N+ regions 1308. A plurality of ballasting resistance 1506 is also illustratively shown, as ballasting resistors $1506_1$ through $1506_v$, for the third N+ region 1308.

The silicide layering is used to provide a low resistance cladding to reduce the sheet resistance of the surface of the regions the suicide covers. As such, the silicide layering reduces the series resistance in the drain (first N+ regions 1308), source (third N+ region 1310), and gate region 1314, which form the GGNMOS transistor 908. The required ballasting is restored by the provided ballasting resistances 1504 and 1506, as will be discussed in further detail below.

Normally, an ESD protection device 102 that is not segmented may have diminished ballasting resistance when fully silicided. Therefore, during an ESD event, a non-segmented GGNMOS (i.e., no GGNMOS segments) is susceptible to a current collapse and may thereby fail prematurely. By providing the layout of the ESD protection device 1502 into alternating SCR 106 and GGNMOS transistor 908 slices, the ESD protection device 1502 may be fully silicided, without collapse of the current conduction region in the drain of the GGNMOS during an ESD event. The ESD protection device 1502 provides such ballasting by its segmentation (i.e. segments).

Figure 16:
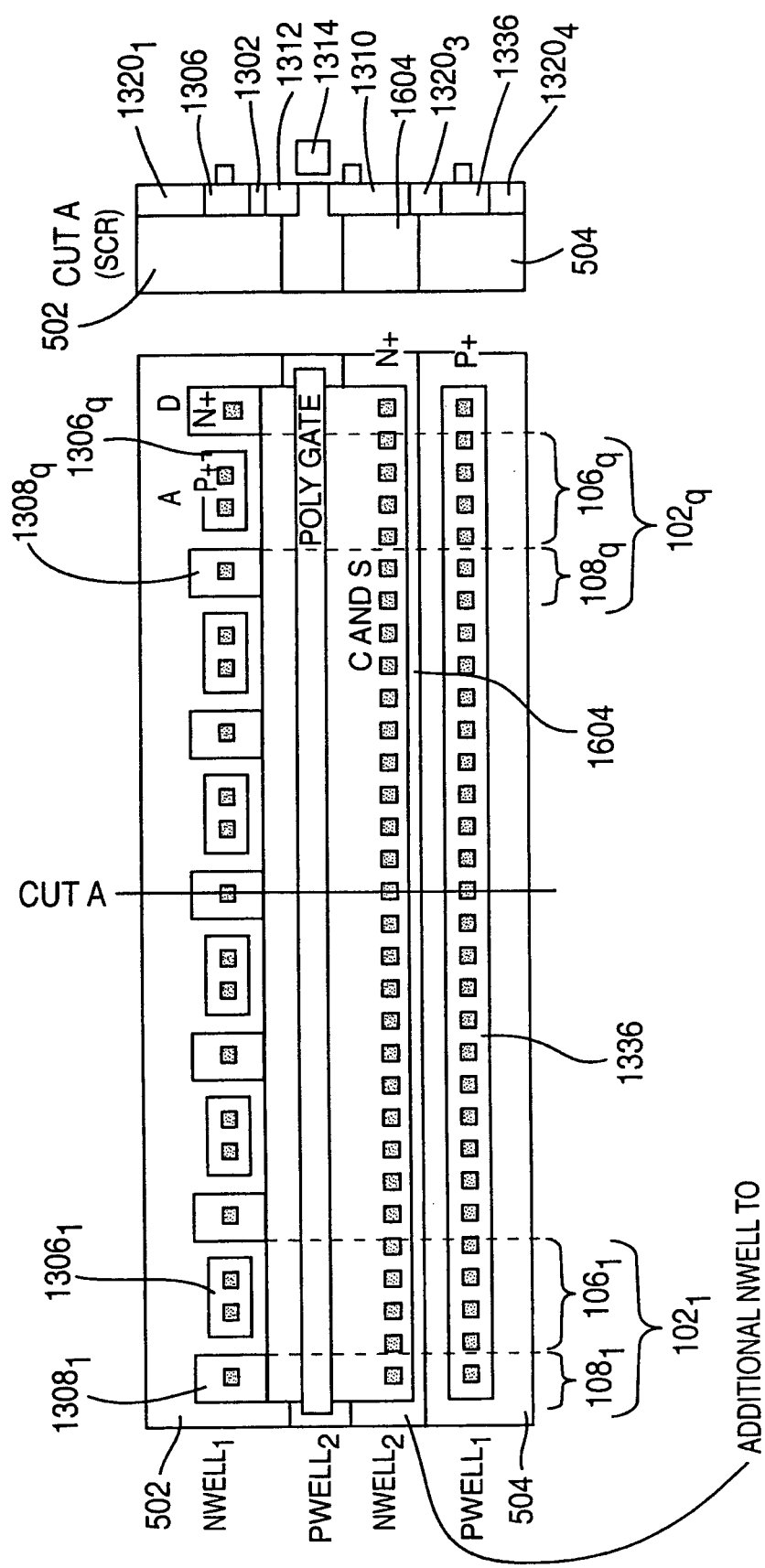

FIG. 16 depicts a fourth layout embodiment of an ESD protection device 1602, and FIG. 16 should be viewed along with FIG. 12. The fourth embodiment of FIG. 16 is the same as the first embodiment of FIG. 13, except that a second N-well 1604 is formed partially in place of the P-well 504 to deepen the SCR cathode 140. In particular, the second N-well 1604 is formed as a deep extension of the third N+ region 1310, which forms the emitter (cathode) of the NPN transistor 116. The purpose of a deep SCR cathode is to provide a larger cross section for the SCR current, while not degrading the local emitter efficiency of the NPN at the gate edge of the N+ region 1310.

Figure 17:
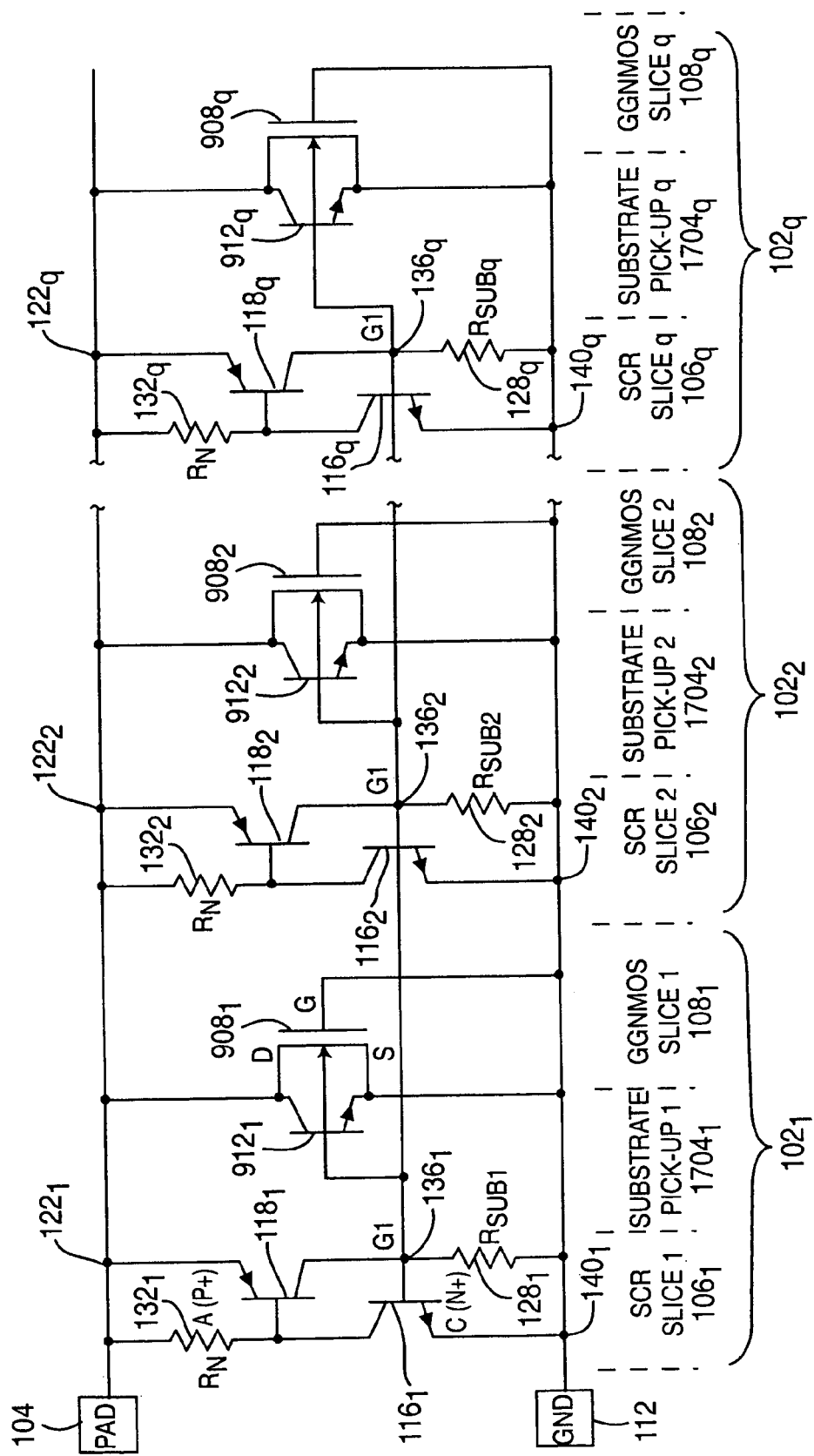
FIG. 17 depicts a schematic diagram of a second embodiment of a hybrid HHISCR protection device having an SCR and GGNMOS trigger device formed in parallel slices.

FIG. 17 depicts a schematic diagram of a second embodiment of a hybrid HHISCR protection device 1702 having an SCR and GGNMOS trigger device formed in parallel slices. In particular, FIG. 17 is the same as FIG. 12, except that the gates of the GGNMOS transistor slices $908_1$ through $908_q$ are coupled to the first trigger gate G1 136, instead of a hard ground 112, as shown in FIG. 12. Coupling the gate of first trigger gate G1 136 provides a substrate pick-up 1704. That is, each gate of each GGNMOS slice 108 forms the substrate pick-ups $1704_1$ through $1704_q$.

The substrate pick-ups 1704 allow the potential at the gates of each NMOS transistor 908 to increase to the potential at the first trigger gate G1 136, which is approximately 0.7 volts. Increasing the NMOS gate to the potential of the first trigger gate G1 136 allows the NMOS to trigger in parallel with the parasitic bipolar transistor 912. As such, FIG. 17 differs from FIG. 12, since the NMOS in the embodiment of FIG. 12 had a hard grounded-gate, which turned the NMOS off, where triggering occurs from the parasitic bipolar transistor 912. An advantage of biasing the gates of each NMOS transistor 908 to the first trigger gate 136, via the substrate pick-ups 1704, is to reduce the trigger voltage required to trigger each SCR slice $106_q$, as well as spread out the triggering across the GGNMOS slices 908 and SCR slices 106.

Figure 18:
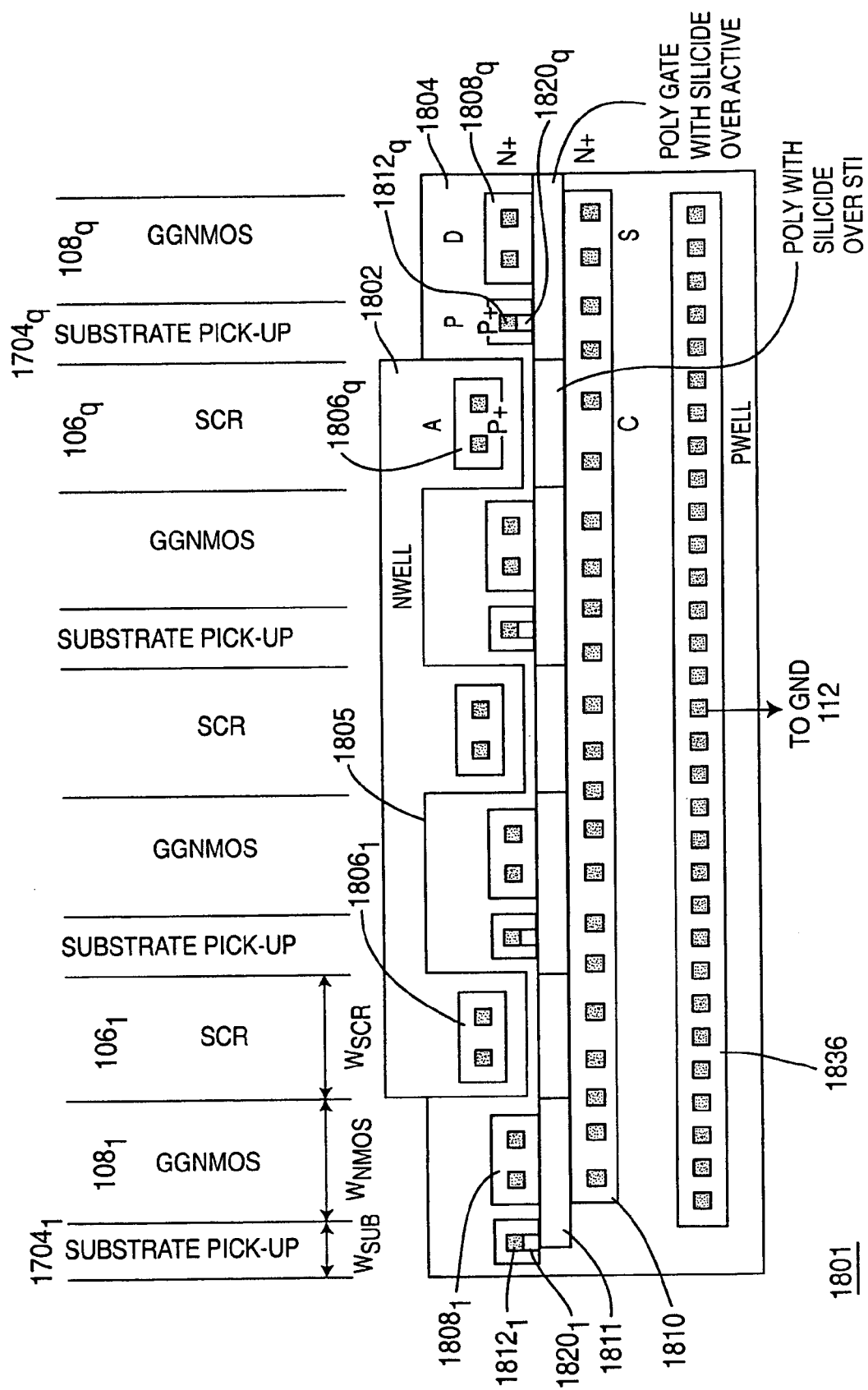
FIG. 18 depicts a top view of the hybrid HHISCR protection device of FIG. 17.

FIG. 18 depicts a top view of the hybrid HHISCR protection device 1702 of FIG. 17. FIG. 18 should be viewed along with FIG. 17. In particular, an N-well 1802 having interdigited fingers $1822_1$ through $1822_u$, and P-well 1804 having interdigited fingers $1820_1$ through $1820_v$ are provided with the fingers alternating and interlocked to form a junction 1805 therebetween. A first plurality of P+ regions $1806_1$ through $1806_q$ is interposed in each of the plurality of interdigited fingers $1822_1$ through $1822_u$ of the N-well 1802. Additionally, a first plurality of N+ regions $1808_1$ through $1808_q$ is respectively interspersed in each of the plurality of interdigited fingers $1820_1$ through $1820_v$ of the P-well 1804, substantially between each the first plurality of P+ regions $1806_1$ through $1806_q$. It is noted that the N-well 1802 surrounds each first P+ region 1806 and extends into the P-well 1804. As such, the N-well 1802 is provided to form the anode of the SCR slices 106.

Each first interspersed P+ region 1806 forms part of an SCR slice 106 and a GGMOS slice 108. Specifically, each first P+ region 1806 forms the emitter (anode 122) of the PNP transistor 118 of the SCR 106. For example, first P+ region 1806 forms the emitter (anode $122_2$) of the PNP transistor $118_2$ of SCR slice $106_2$. Similarly, each first interspersed N+ region 1808 forms the drain of the GGNMOS 908, as well as the collector of the parasitic transistor 912.

A second N+ region 1810 extends over a length of the P-well 1804. The second N+ region 1810 forms the emitter of the NPN transistor 116 (cathode 140) of the SCR 106, as well source of the GGNMOS transistor 908 and emitter of the parasitic transistor 912. The P-well 1804 extends between the interspersed first N+ regions 1808 and the second N+ region 1810. Furthermore, a polysilicon gate region 1814 runs parallel over the P-well 1804 between the second N+ region 1810 and interspersed first N+ regions 1808, and over the P-well 1804.

A second P+ region 1836 is also formed in the P-well 1804 to form the first trigger gate 136 of the SCR 106. The second P+ region 1836 is provided in parallel to the second N+ region 1810, where a portion of the P-well 1804 is disposed therebetween. Furthermore, a plurality of third P+ regions 1704 is also formed in the P-well 1804 to form the local substrate pick-ups 1704. In particular, the plurality of third P+ regions 1704 are interspersed proximate the interspersed first N+ regions 1808 and the gate 1814. The gate 1814 is coupled to each third P+ region 1704 (substrate pick-up) via connections $1820_1$ through $1820_q$.

It is noted that the gate region 1814, second N+ region 1310, and second P+ region 1336 are formed parallel to each other and are common (i.e., shared) to all the ESD protection device slices 102. Furthermore, the gate region 1804, interspersed first N+ regions 1808, and second N+ region 1810 and all P+ regions 1806, 1836, 1804 have a silicide layer thereon.

In a second embodiment, silicide blocking may be provided over a part of the plurality of first interspersed N+ regions 1808 facing the gate 1814, a part of the second N+ region 1810 facing the gate 1814, and the gate region 1814. In another embodiment, a continuous metal connection may be used to connect the substrate pick-ups 1704 (i.e., the third P+ regions 1704), while the poly silicon gate 1814 may now be interrupted into segments associated to each GGNMOS slice 108. As such, in any of the embodiments of the layout, biasing the gates of each NMOS transistor 908 to the first trigger gate 136, via the substrate pick-ups 1704, is to reduce the trigger voltage required to trigger each SCR slice $106_q$, as well as spread out the triggering across GGNMOS slices 908 and the SCR slices 106.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection circuit in a semiconductor integrated circuit (IC) having protected circuitry, comprising:
    a silicon controlled rectifier (SCR), for coupling between a supply line of the IC and ground;
    a first trigger device for coupling from the supply line to a first gate of the SCR;
    a first shunt resistor for coupling between the first gate and ground;
    a first gate control circuit, for coupling between the supply line and ground, and for further coupling to the first gate of the SCR; and
    a common control circuit, for coupling between the supply line and ground, and for further coupling to the first gate control circuit.

2. The ESD protection circuit of claim 1, wherein said first gate control circuit comprises:
    a first NMOS transistor having the drain coupled to the first gate and the source coupled to ground; and
    a first inverter having an input and an output, wherein the output of said inverter is coupled to the gate of the first NMOS transistor and the common control circuit; and
    wherein the first NMOS transistor provides a variable shunt element for the first trigger gate of the SCR.

3. The ESD protection circuit of claim 2, wherein said first inverter comprises:

a first PMOS transistor and a second NMOS transistor, and said first PMOS transistor and second NMOS transistor are serially coupled between the supply line and ground; and
the drains of said NMOS and PMOS transistors form an output of the inverter, wherein the output is connected to the gate of said first NMOS transistor.

4. The ESD protection circuit of claim 3, wherein said common control circuit comprises:
    a third NMOS transistor having the drain for coupling to the supply line, and the source coupled to an input of the inverter circuit;
    a first pull-down resistor for coupling between the input of the inverter circuit and ground;
    a trigger element for coupling between the supply line and the gate of the third NMOS transistor; and
    a second pull-down resistor, for coupling between the gate of the third NMOS transistor and ground.

5. The ESD protection circuit of claim 4, wherein said trigger element is a device selected from the group consisting of a capacitor, a Zener diode coupled in a reverse bias direction between the supply line and the gate of the third NMOS transistor, and a grounded-gate NMOS transistor.

6. The ESD protection circuit of claim 4, further comprising:
    a second trigger device for coupling from a second gate of the SCR to ground; and
    a second gate control circuit for coupling between said supply line and said second gate, and further coupled to said common control circuit.

7. The ESD protection circuit of claim 5, wherein said second gate control circuit comprises a PMOS transistor having the source for coupling to said supply line, the drain coupled to said second trigger gate of the SCR, and the gate of the PMOS transistor coupled to the common control circuit.

8. The ESD protection circuit of claim 3, wherein said common control circuit comprises:
    a second inverter having a second PMOS transistor serially coupled to a third NMOS transistor, said second inverter for coupling between the supply line and ground, and said inverter having an input and an output;
    a pull-up resistor coupled to the input of said second inverter and the supply line; and
    a fourth pull-down NMOS transistor having the drain coupled to the input of said second inverter and the source to ground, said gate of said fourth pull-down NMOS transistor coupled to the first gate of said SCR.

9. An electrostatic discharge (ESD) protection circuit in a semiconductor integrated circuit (IC) having protected circuitry, comprising:
    a silicon controlled rectifier (SCR), for coupling between a protected supply line of the IC and a ground;
    a first trigger device, for coupling from the said protected supply line to a first gate of the SCR;
    a first shunt resistor coupled between the first gate and ground; and
    an NMOS transistor having a drain and a source respectively coupled between the first gate and ground, said NMOS transistor having a gate for coupling to a supply line of the IC having a potential different from the potential of the protected supply line of the IC.

10. The ESD protection circuit of claim 9, further comprising:
    a second trigger device coupled from a second gate of the SCR to ground.

11. The ESD protection circuit of claim 9, further comprising:
a PMOS transistor, having the source for coupling a supply line having a potential greater than the protected supply line, and the drain coupled to the second gate; and
the gate of said PMOS transistor for coupling to a supply line having a potential less than the potential of the supply line connected to the source of said PMOS.

12. An electrostatic discharge (ESD) protection circuit in a semiconductor integrated circuit (IC) having protected circuitry, comprising:
an SCR, having a respective GGNMOS transistor coupled to a first gate of said SCR, and a SGPMOS transistor coupled to a second gate of said SCR, said SCR, GGNMOS and SGPMOS transistors arranged in slices, further comprising:
an N-well;
a P-well positioned adjacent to said N-well and forming a junction therebetween;
a first plurality of P+ regions interspersed in said N-well forming an anode of said SCR, for coupling to a protected supply line, and a source of said SGPMOS transistor;
a first plurality of N+ regions interspersed in said P-well forming a cathode of said SCR, said first plurality of N+ regions for coupling to ground, and a source of said GGNMOS transistor, said first plurality of P+ and N+ regions being aligned and forming SCR and MOS transistor slices;
a second plurality of N+ regions interspersed in said N-well between said first plurality of P+ regions and forming a plurality of second gates and coupled to said anode;
a second plurality of P+ regions interspersed in said P-well between said first plurality of N+ regions and forming a plurality of first gates and coupled to said cathode; and
a third plurality of P+ regions interspersed in said N-well and separated from said first plurality of P+ regions by a respective first plurality of perpendicular gate regions, said third plurality of P+ regions forming a drain of said SGPMOS transistor; said first plurality of perpendicular gates coupled to said anode, said third plurality of P+ regions coupled to said cathode; and
a third plurality of N+ regions interspersed in said P-well and separated from said second plurality of N+ regions by a respective second plurality of perpendicular gate regions, said third plurality of N+ regions forming a drain of said GGNMOS transistor; said second plurality of perpendicular gates coupled to said cathode, said third plurality of N+ regions coupled to said anode.

13. An electrostatic discharge (ESD) protection circuit in a semiconductor integrated circuit (IC) having protected circuitry, comprising:
an N-well;
a P-well positioned adjacent to said N-well and forming a junction therebetween;
a first P+ region, forming a drain of a SGPMOS transistor disposed in said N-well, said first P+ region for coupling to ground;
a second P+ region forming an emitter of a PNP transistor of an SCR and forming a source of SGPMOS disposed in said N-well and parallel to said first P+ region, said second P+ region for coupling to a supply line of the IC;
a first gate region of said SGPMOS disposed parallel and between said first and second P+ regions, and over said N-well, said first gate region for coupling to the supply line of the IC;
a first N+ region, forming the second gate of an SCR disposed in said N-well and parallel to said first and second P+ regions, said first N+ region for coupling to the supply line of the IC;
a second N+ region forming an emitter of an NPN transistor of said SCR and forming a source of a GGNMOS disposed in said P-well, said second N+ region for coupling to ground;
a third N+ region, forming a drain of a GGNMOS transistor disposed in said P-well parallel to said second N+ region, said third N+ region for coupling to the supply line of the IC;
a second gate region disposed in parallel and between said second and third N+ regions, over said P-well, said gate region for coupling to ground; and
a third P+ region, forming a second gate of the SCR disposed in said P-well and parallel to said second and third N+ regions, said third P+ region for coupling to ground.

14. An electrostatic discharge (ESD) protection circuit in a semiconductor integrated circuit (IC) having protected circuitry, comprising:
an SCR, having a respective GGNMOS transistor having a parasitic NPN transistor having a the base coupled to a first gate of said SCR, said SCR and GGNMOS transistor arranged in slices, further comprising:
an N-well;
a P-well, positioned adjacent to said N-well and forming a junction therebetween;
a first plurality of P+ regions interspersed in said N-well, and forming an emitter of a PNP transistor of said SCR and adapted for coupling to a supply line of the IC;
a first plurality of N+ regions interspersed in said N-well, and forming a drain contact region of said GGNMOS transistor, said first plurality of N+ regions for coupling to the supply line of the IC,
a second N+ region, disposed over said junction of said N-well and P-well, and coupling to said first plurality of N+ regions and forming drain of said GGNMOS transistor;
a third N+ region, forming an emitter of the NPN transistor and the source of said GGNMOS transistor, disposed in said P-well and parallel to said second N+ region, said third N+ region for coupling to ground;
a gate region, disposed in parallel and between said second and third N+ regions, over said P-well, and for coupling to ground;
a second P+ region, forming said first gate of said SCR, disposed in said P-well and parallel with said second and third N+ regions, said second P+ region for coupling to ground.

15. The ESD protection circuit of claim 14, further comprising:
a polysilicon layer disposed over said N-well and between the first P+ regions and the first interspersed N+ regions.

16. The ESD protection circuit of claim 14, wherein portions of the second and third N+ regions facing the gate region, and the gate region are silicide blocked.

17. The ESD protection circuit of claim 14, wherein said first interspersed N+ regions and third N+ region are segmented and resistor-ballasted, and said first and second P+ regions, said first, second, and third N+ regions, and said gate region are fully silicided.

18. The ESD protection circuit of claim 14, further comprising a second N-well disposed below a portion of said third N+ region facing the second P+ region.

19. An electrostatic discharge (ESD) protection circuit in a semiconductor integrated circuit (IC) having protected circuitry, comprising:
an SCR having a respective GGNMOS transistor coupled to a first gate of said SCR, said SCR and GGNMOS transistor arranged in slices, further comprising:
an N-well having interdigited fingers;
a P-well having interdigited fingers, interlocking with said N-well fingers and forming a junction therebetween;
a first plurality of P+ regions disposed in each of the interdigitated fingers of said N-well, and forming an emitter of a PNP transistor of said SCR, and adapted for coupling to a supply line of the IC, said;
a first plurality of N+ regions disposed in each of the interdigitated fingers of said P-well and forming a drain of said GGNMOS transistor, said first plurality of N+ regions coupled to the supply line,
a second N+ region disposed in said P-well and forming an emitter of the NPN transistor and the source of said GGNMOS transistor, said second N+ regions for coupling to ground;
a gate region, disposed in parallel and between said first plurality of interspersed N+ regions and the second N+ region, over said P-well, and adapted for coupling to ground;
a second P+ region, forming said first gate, disposed in said P-well and parallel with said second N+ region, and adapted for coupling to ground; and
a plurality of third P+ regions disposed in each of the interdigitated fingers of said P-well and between said first plurality of P+ regions and said first plurality of N+ regions, each third P+ region coupled to the gate region forming a local substrate pick-up.

20. The ESD protection circuit of claim 19, wherein a portion of the second and third N+ regions facing the gate region, and the gate region are silicide blocked.

21. An electrostatic discharge (ESD) protection circuit in a semiconductor integrated circuit (IC) having protected circuitry, comprising:
an SCR comprising
a N-well;
a P-well positioned adjacent to said N-well and forming a junction therebetween;
a first plurality of P+ regions interspersed in said N-well forming an anode;
a first plurality of N+ regions interspersed in said P-well forming a cathode and aligned with said first plurality of P+ regions, each said first N+ region and first P+ region having a first length in a range from 0.16 to 10 micrometers;
a second plurality of P+ regions interspersed in said P-well between said first plurality of N+ regions and forming a plurality of first gates, a second plurality of N+ regions interspersed in said N-well between said first plurality of P+ regions and forming a plurality of second gates; each said second N+ region and second P+ region having a second length in a range of 0.2 to 2 micrometers; and
wherein a distance between the first P+ region and the second N+ region are in a range from 0.12 to 1.2 micrometers, and a distance between the first N+ region and the second P+ regions are in a range from 0.12 to 1.2 micrometers.

22. An electrostatic discharge (ESD) protection circuit in a semiconductor integrated circuit (IC) having protected circuitry, comprising:
a silicon controlled rectifier (SCR), for coupling between a first and a second supply line of the IC;
a trigger device for coupling a gate of the SCR to one of said first and second supply lines; and
a means for reducing an intrinsic resistance associated with said gate of the SCR.

23. The ESD protection circuit of claim 22, wherein during powered-on operation of said IC, said means for reducing intrinsic resistance adapts a holding current to have a value greater than a current derived from a specified latch-up current for said IC.

24. The ESD protection circuit of claim 23, wherein during powered-on operation of said IC, said means for reducing intrinsic resistance adapts a trigger current of said SCR to a value greater than a current derived from said specified latch-up current for said IC.

25. The ESD protection circuit of claim 22, wherein during non-powered ESD operation of said IC, said means for reducing intrinsic resistance adapts a holding current of said SCR to a value less than a current derived from said specified latch-up current for said IC.

26. The ESD protection circuit of claim 25, wherein during non-powered ESD operation of said IC, said means for reducing intrinsic resistance adapts a trigger current of said SCR to a value less than a current derived from said specified latch-up current for said IC.

27. The ESD protection circuit of claim 22, wherein said means for reducing an intrinsic resistance comprises a resistive shunt formed in parallel to said intrinsic resistance.

28. The ESD protection circuit of claim 22, wherein said means for reducing an intrinsic resistance comprises reducing a length of each of a plurality of first regions and a plurality of second regions respectively forming an anode and cathode of said SCR.

29. The ESD protection circuit of claim 22, wherein said means for reducing an intrinsic resistance comprises reducing a length between of each of a plurality of regions forming trigger taps of said gate and at least one of an anode and cathode of said SCR.

30. The ESD protection circuit of claim 22, wherein said trigger device is coupled to a first gate of said SCR and said first supply line, said first supply line having a potential greater than said second supply line.

31. The ESD protection circuit of claim 30, wherein said intrinsic resistance comprises a resistance of a substrate forming said first gate.

32. The ESD protection circuit of claim 31, wherein said resistive shunt comprises a shunt resistor for coupling between the first gate and the second supply line.

33. The ESD protection circuit of claim 30, wherein said first and second supply lines respectively comprise a positive voltage potential and ground.

34. The ESD protection circuit of claim 22, wherein said trigger device is coupled to a second gate of said SCR and said second supply line, said first supply line having a potential greater than said second supply line.

35. The ESD protection circuit of claim 34, wherein said intrinsic resistance comprises a resistance of an N-well forming said second gate.

36. The ESD protection circuit of claim 35 wherein said resistive shunt comprises a shunt resistor for coupling between the second gate and the first supply line.

37. The ESD protection circuit of claim 34 wherein said first and second supply lines respectively comprise a positive voltage supply and ground.

38. An electrostatic discharge (ESD) protection circuit in a semiconductor integrated circuit (IC) having protected circuitry, comprising:
   a silicon controlled rectifier (SCR), for coupling between a supply line of the IC and a ground line;
   a trigger device for coupling from the supply line to a second gate defined by an N-well of the SCR;
   an N-well resistor for coupling between the second gate and the supply line; and
   a shunt resistor for coupling between the second gate and the supply line, wherein said shunt resistor has a resistance value lower than the N-well resistor.

39. The ESD protection circuit of claim 38, wherein the N-well resistor comprises an intrinsic resistance of the N-well of the protection circuit.

40. The ESD protection circuit of claim 38, wherein the shunt resistor is selected from the group comprising a fixed resistor and a variable resistor.

41. The ESD protection circuit of claim 38, wherein the trigger device comprises one of a grounded-gate NMOS device, a source-connected gate PMOS, a Zener diode in a reverse conduction direction, and a small diode chain in a forward conduction direction.

42. The ESD protection circuit of claim 38, further comprising:
   at least one diode, coupled in a forward conduction direction from a cathode of the SCR to ground.

43. The ESD protection circuit of claim 38, further comprising:
   a latch-up (LU) control circuit, for coupling between said supply line and ground, and further coupled to said second gate via said shunt resistor.

44. The ESD protection circuit of claim 43, wherein the latch-up (LU) control circuit is further coupled to a reference supply line, which is coupled to ground via parasitic capacitance.

45. The ESD protection circuit of claim 43, wherein said second gate comprises a plurality of second gates, said shunt resistor for coupling between said supply line and said plurality of second gates, and said second latch-up (LU) control circuit for further coupling to each second gate of each SCR finger via said shunt resistor.

46. The ESD protection circuit of claim 38, wherein said shunt resistor adapts a holding current of said SCR to a value greater than a current derived from a specified latch-up current for said IC.

47. The ESD protection circuit of claim 46, wherein said shunt resistor adapts a trigger current of said SCR to a value greater than a current derived from said specified latch-up current for said IC.

48. An electrostatic discharge (ESD) protection circuit in a semiconductor integrated circuit (IC) having protected circuitry, comprising:
   an SCR comprising
      an N-well;
      a P-well positioned adjacent to said N-well and forming a junction therebetween;
      a first elongated P+ region disposed parallel to said junction in said N-well, said first elongated P+ region forming an anode of said SCR;
      a first elongated N+ region disposed parallel to said junction and in said P-well, said first elongated N+ region forming a cathode of said SCR;
      a second elongated P+ region disposed parallel to said first elongated P+ region in said P-well, said second elongated P+ region forming a first gate of said SCR;
      a second elongated N+ region disposed parallel to said first elongated N+ region in said N-well, said second elongated N+ region forming a second gate of said SCR; and
   wherein a distance between the first elongated P+ region and the second elongated N+ region is in a range from 0.12 to 1.2 micrometers, and a distance between the first elongated N+ region and the second elongated P+ region is in a range from 0.12 to 1.2 micrometers.

* * * * *